US006884565B2

(12) United States Patent
Takahashi et al.

(10) Patent No.: US 6,884,565 B2
(45) Date of Patent: Apr. 26, 2005

(54) PLANOGRAPHIC PRINTING PLATE PRECURSOR

(75) Inventors: Miki Takahashi, Shizuoka-ken (JP); Hisashi Hotta, Shizuoka-ken (JP); Hidehito Sasaki, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 36 days.

(21) Appl. No.: 10/653,471

(22) Filed: Sep. 3, 2003

(65) Prior Publication Data

US 2004/0076904 A1 Apr. 22, 2004

(30) Foreign Application Priority Data

Sep. 3, 2002 (JP) .......................... 2002-257484
May 9, 2003 (JP) .......................... 2003-131947

(51) Int. Cl.$^7$ .................................................. G03F 7/11
(52) U.S. Cl. ................. 430/270.1; 430/138; 430/271.1; 430/281.1
(58) Field of Search ................... 430/270.1, 271.1, 430/273.1, 281.1, 138

(56) References Cited

U.S. PATENT DOCUMENTS

| 3,136,636 A | 6/1964 | Dowdall et al. |
| 4,483,913 A | 11/1984 | Eklund et al. |
| 6,440,633 B1 | 8/2002 | Kawauchi et al. |

FOREIGN PATENT DOCUMENTS

| EP | 1 396 756 A2 * | 3/2004 | ............. G03F/7/11 |
| JP | 10-69092 A | 3/1998 | |
| JP | 2000-108538 A | 4/2000 | |
| JP | 2004-294909 A * | 10/2004 | ............. G03F/7/11 |

* cited by examiner

Primary Examiner—Barbara L. Gilliam
(74) Attorney, Agent, or Firm—Sughrue Mion, PLLC

(57) ABSTRACT

The present invention relates to a planographic printing plate precursor, in which an intermediate layer comprising a polymer having a lactone group and a recording layer are successively provided on or over a support. The polymer preferably has not only the lactone group but also an acidic group.

15 Claims, No Drawings

PLANOGRAPHIC PRINTING PLATE PRECURSOR

CROSS-REFERENCE TO RELATED APPLICATION

This application claims priority under 35 USC 119 from Japanese patent Application Nos. 2002-257484 and 2003-131947, the disclosure of which is incorporated by reference herein.

BACKGROUND OF THE INVENTION

1. Field of the Invention

The present invention relates to a planographic printing plate precursor, more specifically, a negative or positive type planographic printing plate precursor which can be directly made a printing plate by scanning exposure based on digital signals, is superior in printing durability, and generates no stains in a non-image portion.

2. Description of the Related Art

In recent years, with development in solid lasers or semiconductor lasers having a light emission wavelength within a near infrared range or infrared ray range, more attention has been paid to systems using such infrared ray lasers as systems in which a printing plate is made up directly from digital data stored in a computer.

As the material for a positive type planographic printing plate for direct plate-making with infrared rays, there is disclosed, for example, a material obtained by adding a substance which absorbs light to generate heat and a positive type photosensitive compound such as a quinine diazide compound to a resin soluble in aqueous alkali solution (see Japanese Patent Application Laid-Open (JP-A) No. 7-285275). In an image portion of a precursor for such a positive type planographic printing plate, the positive type photosensitive compound functions as a dissolution inhibitor which substantially decreases the solubility of the resin soluble in aqueous alkali solution. In a non-image portion thereof the compound is decomposed by heat to lose the dissolution inhibiting capability. As a result, the compound and the resin soluble in aqueous alkali solution, in the non-image portion, is removed by development, to form an image.

It is known that onium salts or compounds which can make hydrogen bond nets having a low alkali solubility have an effect of suppressing the dissolution of the alkali-soluble polymer in the alkali solution. Regarding an image forming material which can be exposed with an infrared ray laser, it is that a composition in which a cationic infrared ray absorbing dye is used as the agent for suppressing the dissolution of the alkali soluble polymer exhibits positive type effect (see WO No. 97/39894 pamphlet). This positive type effect is the effect that the infrared ray absorbing dye absorbs a laser ray and due to the generated heat, the suppression of the dissolution of the polymer film in the laser-radiated portion disappears, thereby an image is formed.

An example of a negative type image forming method is a recording method in which using an acid generated by light or heat as a catalyst, condensation crosslinking reaction is caused by heating treatment after exposure, the exposed portion of a recording layer is cured to form an image portion. And a technique utilizing such an acid catalyst crosslinking type recording layer is known (see JP-A No. 7-271029). Another example is a recording method in which using radicals generated by light or heat as an initiator, a polymerization reaction is caused and the exposed portion of a recording layer is cured to form an image portion. As a printing plate having such a light or heat polymerization type recording layer, a technique in which a photopolymerizable or heat polymerizable composition is used as a recording layer is known (see, for example, JP-A Nos. 8-108621 and 9-34110).

About supports used in such planographic printing plates, hitherto research has been actively made for making the surface of the supports hydrophilic in order to prevent stains on non-image portions. For example, in the case that a metal support such as an aluminum plate is used as a substrate, various techniques are suggested, examples of which include an anode-oxidized aluminum substrate, and an anode-oxidized aluminum substrate further treated with silicate to make the hydrophilicity higher.

However, it cannot be necessarily the case that various treatments for improving the hydrophilicity are superior in affinity to recording layers. And there has been a problem that in some cases, the adhesion between the support and the recording layer formed thereon is impaired so that the recording layer is peeled under strict recording conditions and sufficient printing durability cannot be obtained.

Thus, methods are suggested in which at least one layer selected from various intermediate layers is formed between the support and the recording layer, in order to improve the contact characteristics between the recording layer and the support surface to which hydrophilicity has been imparted. When a material having a functional group superior in affinity to the resin material which constitutes the recording layer or the support surface is used for the intermediate layer, the contact characteristics in an image portions is improved and a sufficient printing durability can be obtained. However, in a non-image portion, the recording layer is not quickly removed at the development, and remains as a film on the support surface to cause a problem that adhesion of ink onto the remaining film causes stains in the non-image portion.

It has been therefore desired to develop a support which has superior surface hydrophilicity thereof and gives both superior contact characteristics to a recording layer in an image portion and superior removability of the recording layer in a non-image portion.

In order to solve the above-mentioned various problems, a technique of forming an intermediate layer made of a water-soluble polymer such as polyacrylic acid or carboxymethylhydroxyethylcellulose (see U.S. Pat. No. 3,136, 636) is suggested. However, this technique does not give a satisfactory printing durability. Also, a technique of forming an intermediate layer made of a tertiary ammonium compound such as poly(dimethyldiallylammonum chloride) is suggested (see U.S. Pat. No. 4,483,913). However, this technique is also not satisfactory since stains are generated in a non-image portion thereof.

Furthermore, the inventors suggested a planographic printing plate having an intermediate layer containing a polymer compound comprising a specific structural unit such as p-vinyl benzoate (JP-A No. 10-69092). The inventors also suggested a planographic printing plate precursor having an intermediate layer containing a polymer (random polymer) comprising a monomer having an acid group and a monomer having an onium group (JP-A No. 2000-108538). These techniques give certain degree of improvements. However, it is desired in the present situation to improve the contact characteristics between a support and a recording layer, make the printing durability of a planographic printing plate precursor higher, and suppress the generation of stains effectively in non-image portions of the plate.

SUMMARY OF THE INVENTION

Considering the above-mentioned drawbacks of the prior art, an object of the present invention is to provide a planographic printing plate precursor which can be directly made a printing plate by scanning exposure based on digital signals, is superior in printing durability, and generates no stains in a non-image portion.

The inventors made earnest investigations. As a result, the inventors have found out that the above-mentioned problems can be solved by forming, between a support and a recording layer, an intermediate layer comprising a polymer which contains a lactone group, and the invention has been completed.

The planographic printing plate precursor of the present invention is a planographic printing plate precursor, in which an intermediate layer comprising a polymer which contains a lactone group and a recording layer are successively provided on or over a support.

In a preferred embodiment, the polymer comprises not only the lactone group but also an acid group.

The planographic printing plate precursor of the invention is a planographic printing plate precursor in which an intermediate layer comprising a polymer which contains a lactone group is provided between a support and a recording layer. The lactone group usually exhibits hydrophobicity. However, when brought into contact with an aqueous alkali solution such as developer, the cyclic structure thereof is opened as shown in the following chemical reaction equation to generate a carboxylic acid and a hydroxide group and the resultant group becomes hydrophilic (alkali soluble).

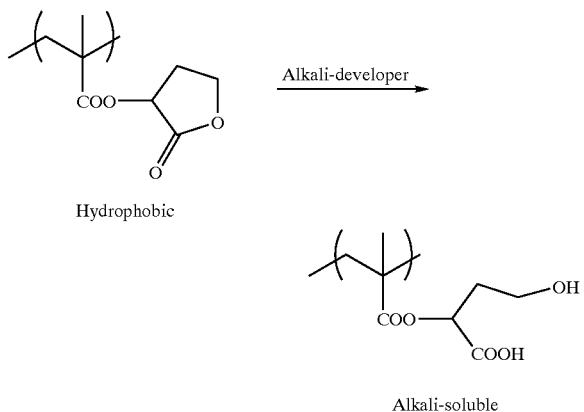

In other words, when a polymer having a lactone group is used as a component of an intermediate layer of a planographic printing plate precursor, a recording layer itself, which is impermeable to alkali developer (hydrophobic), functions as a protective layer for the intermediate layer in an image portion; therefore, the intermediate layer is not exposed to the developer, and the hydrophobicity of the intermediate layer is maintained. It is therefore considered that the planographic printing plate precursor can keep high printing durability since the intermediate layer is superior in the contact characteristics with the recording layer, which is hydrophobic, and further the intermediate layer suppresses the permeation of moistening-water at the time of printing.

On the other hand, in a non-image portion, the intermediate layer is exposed to the developer when the recording layer is removed by the developer. As a result, the lactone ring is opened so that the intermediate layer comes to exhibit high alkali solubility. It is considered that by this mechanism, the recording layer and the intermediate layer is rapidly dissolved without generating any remaining film, for example, even if a developer having a lowered activity is used, and the printing plate precursor is superior in developing property.

The first aspect of the invention is to provide a planographic printing plate precursor (S), comprising an intermediate layer which includes a polymer having a lactone group, and a recording layer successively formed on a support.

The second aspect of the invention is to provide the planographic printing plate precursor (S), wherein the polymer having a lactone group comprises a monomer having a lactone group which is represented by the following General formula (A) as a structure unit:

General formula (A)

wherein in General formula (A), R represents a hydrogen atom, an alkyl group, or a halogen atom; X represents a group represented by the following General formula (B) or (C); and Y represents a divalent connecting group:

General formula (B)

General formula (C)

wherein in General formulae (B) and (C), $R^1$ through $R^8$ each independently represent a hydrogen atom or a hydrocarbon group having 1 to 30 carbon atoms which may be substituted.

The third aspect of the invention is to provide the planographic printing plate precursor (S), wherein the lactone group in the polymer having a lactone group has a 5-membered ring lactone structure.

The fourth aspect of the invention is to provide the planographic printing plate precursor (S), wherein a content of a monomer having a lactone group in the polymer having a lactone group is at least 1% by mol.

The fifth aspect of the invention is to provide the planographic printing plate precursor (S), wherein a content of a monomer having a lactone group in the polymer having a lactone group is from 10 by mol to 95% by mol.

The sixth aspect of the invention is the planographic printing plate precursor (S), wherein a weight-averaged molecular weight of the polymer having a lactone group is from 500 to 1,000,000.

The seventh aspect of the invention is to provide the planographic printing plate precursor (S), wherein a coated amount of the intermediate layer after drying is from 1 to 100 mg/m².

The eighth aspect of the invention is to provide the planographic printing plate precursor (S), wherein the polymer having a lactone group further has an organic-structure-containing organic group.

The ninth aspect of the invention is to provide the planographic printing plate precursor (S), wherein the polymer having a lactone group further has an acid group.

The tenth aspect of the invention is to provide the planographic printing plate precursor (S), wherein the polymer having a lactone group further has an acid group and an onium-structure-containing organic group.

The eleventh aspect of the invention is to provide the planographic printing plate precursor (S), wherein the intermediate layer comprising the polymer having a lactone group and a positive-type photosensitive layer have been successively formed on the support.

The twelfth aspect of the invention is to provide the planographic printing plate precursor (S), wherein the intermediate layer comprising the polymer having a lactone group and a negative-type photosensitive layer have been successively formed on the support.

The thirteenth aspect of the invention is to provide the planographic printing plate precursor (S), wherein the intermediate layer comprising the polymer having a lactone group and a photosensitive layer comprising a compound which can form a hydrophobic portion by heating or irradiation of a radiation, have been successively formed on the support.

The fourteenth aspect of the invention is to provide the planographic printing plate precursor (S), wherein the intermediate layer comprising the polymer having a lactone group and a photosensitive layer comprising a compound which can form a hydrophobic portion by heating or irradiation of a radiation, have been successively formed on the support, and the compound which can form a hydrophobic portion by heating or irradiation of a radiation is one of (a) a fine particle polymer having a heat-responsive functional group, or (b) a microcapsule encapsulating a compound having a heat-responsive functional group.

The fifteenth aspect of the invention is to provide the planographic printing plate precursor (S), wherein the intermediate layer comprising the polymer having a lactone group and an infrared-laser sensitive positive-type photosensitive layer have been successively formed on the support.

DETAILED DESCRIPTION OF THE INVENTION

The planographic printing plate precursor of the present invention is a planographic printing plate precursor, in which an intermediate layer comprising a polymer which contains a lactone group and a recording layer are successively provided on or over a support. The structure of the planographic printing plate precursor of the invention will be described in detail hereinafter.

[Intermediate Layer]

First, the intermediate layer comprising a polymer which contains a lactone group (hereinafter referred to as the "specific polymer" in some cases) will be described, the layer being a characteristic of the planographic printing plate precursor of the invention.

The specific polymer preferably has, in a molecule thereof, a lactone group and an onium-structure-containing functional group. More preferably, the specific polymer is a copolymer comprising both of a monomer having a lactone group and a monomer having an onium-structure-containing functional group.

[The Lactone Group and a Monomer Having the Lactone Group]

The lactone group according to the invention can be any group which has a lactone ring structure. Particularly preferred is a lactone group having a five-membered ring lactone structure. An example of the method for introducing such a lactone group into the polymer is a method of polymerizing or copolymerizing a monomer having the lactone group in accordance with a known polymerization method.

Examples of the monomer having the lactone group include a monomer having in the molecule thereof a lactone group, and an ethylenic addition-polymerizable unsaturated group such as a vinyl group, allyl group or (meth)acrylic group. A monomer which has two or more lactone groups can also be used.

The lactone group is bonded to the ethylenic unsaturated group via a single bond or a linkage group and the molecular weight of such a linkage group is preferably 1000 or less.

Monomers that can be favorably used according to the invention are represented by the following general formula (A).

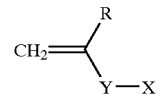

General formula (A)

In the general formula (A), R represents a hydrogen atom, an alkyl group, or a halogen atom; R favorably represents a hydrogen atom or a methyl group; X represents a group represented by the following general formula (B) or (C); and Y represents a divalent connecting group.

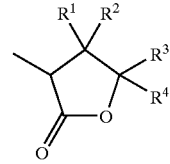

General formula (B)

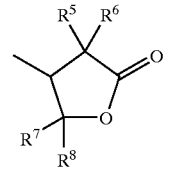

General formula (C)

In the general formulae (B) and (C), $R^1$ through $R^8$ each independently represent a hydrogen atom or a hydrocarbon group having 1 to 30 carbon atoms which may be substituted. The hydrocarbon group having 1 to 30 carbon atoms is not particularly restricted. Examples of the hydrocarbon group having 1 to 30 carbon atoms include an alkyl group, an alkenyl group, an alkynyl group, an aryl group, or a heteroaryl group containing at least one hetero-atom selected from the group consisting of a nitrogen atom, an oxygen atom, and a sulfur atom. Among them, an alkyl group is preferable.

In the general formulae (B) and (C), it is particularly preferable that all of $R^1$ through $R^8$ are hydrogen atoms, or that $R^1$ and $R^2$ are methyl groups and $R^3$ and $R^4$ are hydrogen atoms.

The divalent connecting group represented by Y in the general formula (A) may be a divalent hydrocarbon group optionally having a group which contains at least one hetero-atom selected from the group consisting of a nitrogen atom, an oxygen atom, and a sulfur atom. The divalent hydrocarbon group may further have a substituent.

The divalent hydrocarbon group is preferably a divalent hydrocarbon group having 1 to 30 carbon atoms and containing at least one bond such as an ester bond, an amide bond, an urea bond, a phenylene bond, an ether bond, and a thioether bond. The divalent hydrocarbon group particularly preferably comprises a structure represented by any one of the following structures.

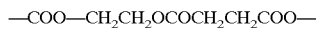

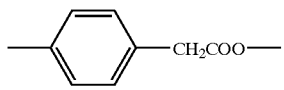

Specific examples of the monomer having the lactone group according to the invention include pantoyllactone (meth)acrylate, α-(meth)acryloyl-γ-butyrolactone, β-(meth)acryloyl-γ-butyrolactone, and the following compounds. In the invention, however, the monomer is not limited to these examples. (In the specification, "(meth)acryl" refers to both "acryl" and "methacryl" or either "acryl" or "methacryl".)

In the following examples of the monomer having a lactone group, l represents an integer of 1 to 30, preferably 2 to 15; m and n each independently represent integers of 1 to 100, preferably 1 to 30; when both m and n are present in the monomer, the sum of m and n is preferably no more than 100.

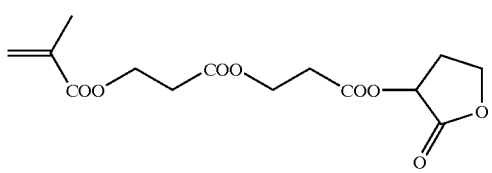

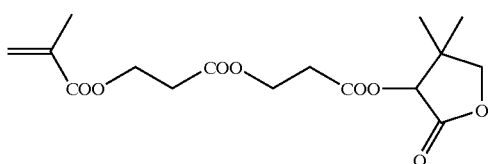

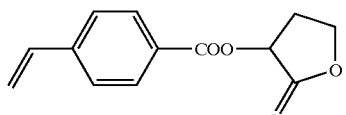

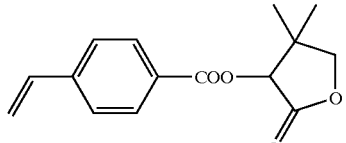

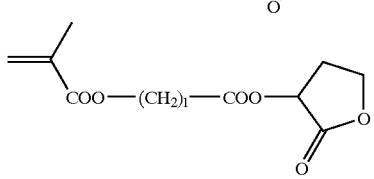

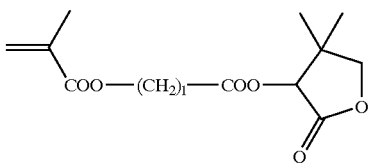

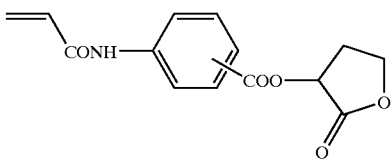

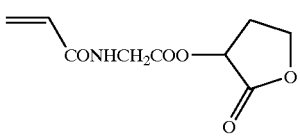

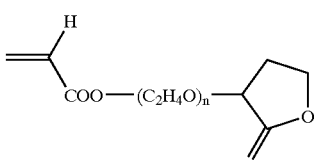

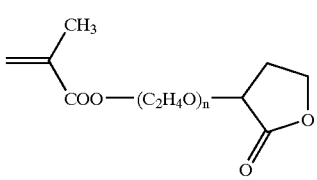

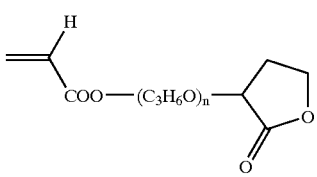

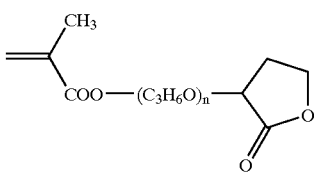

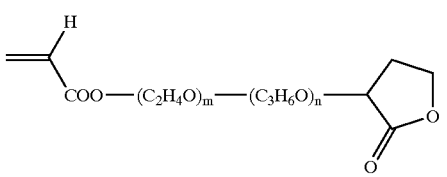

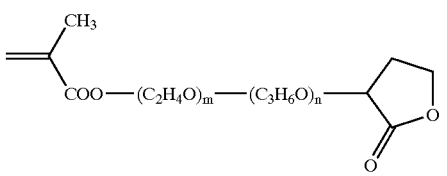

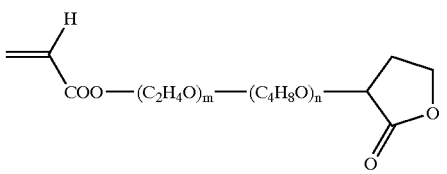

-continued

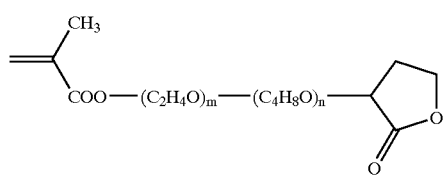
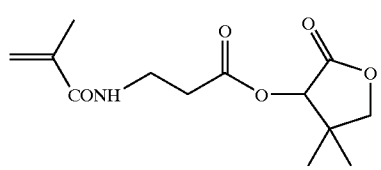
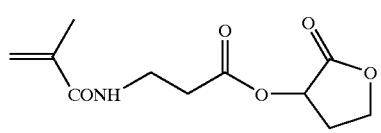
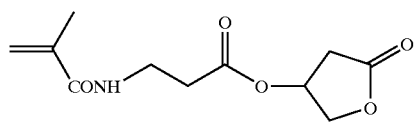
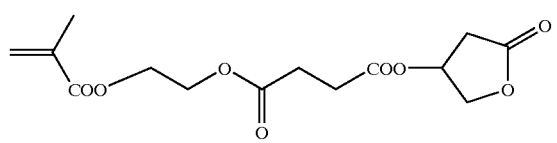
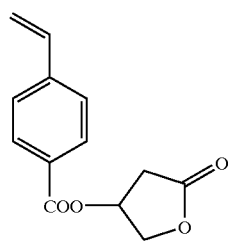
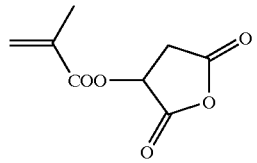
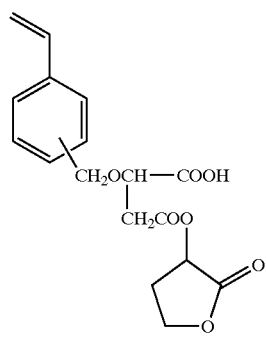

-continued

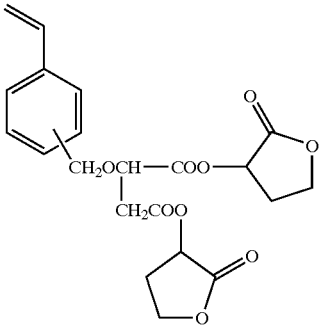
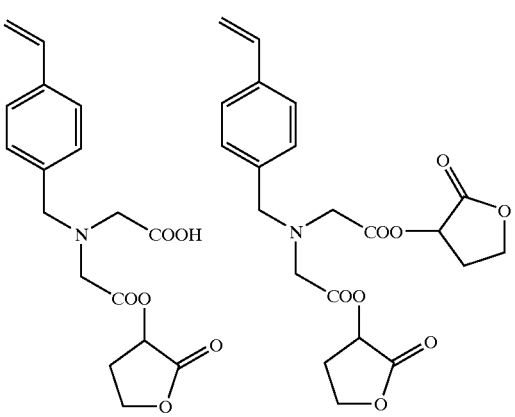
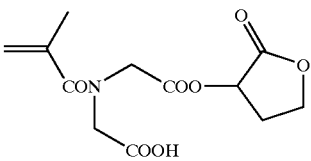
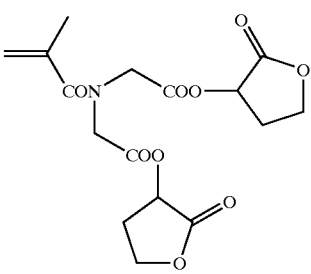

The monomer having a lactone group recited in the invention is particularly preferably a γ-butyrolactone having a polymerizable group on a-position from the viewpoint of availability of the raw materials, easiness of the synthesis, decomposability by alkali.

The specific polymer according to the invention can be obtained by polymerizing at least one monomer selected from the monomers having lactone groups, or can be obtained by copolymerizing at least one monomer selected from the monomers having lactone groups with at least one monomer selected from the monomers having acid groups, monomers having onium-structure-containing functional groups, and other monomers, all of which will be described later, in accordance with the necessity. In general, such monomers can be polymerized or copolymerized, utilizing a known suspension polymerization method or solution polymerization method. The copolymer may be constituted by any one of block copolymer, random copolymer and graft copolymer.

The content of the structural unit having the lactone group in the specific polymer is preferably at least 1% by mol, more preferably, at least 5% by mol, and most preferably, at least 10% by mol. Such a specific polymer may be made only of the structural unit having the lactone group. However, the content of the structural unit having the lactone group is preferably from 10 to 95% by mol in order to keep the printing durability.

The weight average molecular weight of the specific polymer is preferably from 500 to 1,000,000, more preferably from 1,000 to 500,000, further preferably, 2,000 to 200,000.

[Onium-structure-containing unctional Group and a Monomer Having the Onium-structure-containing Functional Group]

According to the invention, the specific polymer preferably contains an onium structure in the viewpoint of the interaction with the support or the photosensitive layer. In the invention, the onium-structure-containing functional group is not particularly restricted; any onium-structure-containing functional group having a known onium-structure-containing functional group structure may be used in the invention. A method for introducing such an onium-structure-containing functional group to the polymer may be include polymerization or copolymerization of monomers having an onium-structure-containing functional group by a known polymerization method.

The monomer having an onium-structure-containing functional group may be a monomer having, in a molecule thereof, an onium-structure-containing functional group and an ethylenic, addition-polymerizable unsaturated group such as a vinyl group, an allyl group, or a (meth)acrylic group. The monomer may have two or more onium-structure-containing functional group groups in a molecule thereof.

The onium-structure-containing functional group and the ethylenic unsaturated group is combined via a single bond or a connecting group. Such a connecting group preferably has a molecular weight of no more than 1000.

The monomers having onium-structure-containing functional groups that can be favorably used in the invention are represented by the following general formulae (I) to (III).

General formula (I)

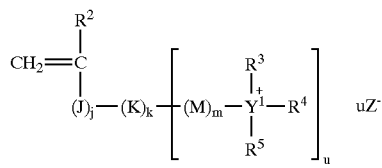

General formula (II)

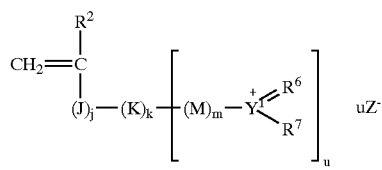

General formula (III)

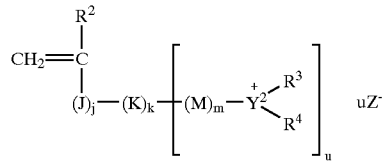

In the general formulae (I) to (III), J represents a divalent connecting group; K represents an aromatic connecting group or a substituted aromatic connecting group; M represents a divalent connecting group; $Y^1$ represents an atom of the group V of the Periodic Table; $Y^2$ represents an atom of the group VI of the Periodic Table; $Z^-$ represents a counter anion; $R^2$ represents a hydrogen atom, an alkyl group, or a halogen atom; $R^3$, $R^4$, $R^5$, and $R^7$ each independently represent a halogen atom, an alkyl group, an aromatic group, or an aralkyl group, each of which may be substituted. $R^6$ represents an alkylidyne group or a substituted alkylidyne group; $R^3$ and $R^4$, or $R^6$ and $R^7$ each may be bonded to each other to form a ring; j, k, and m each independently represent 0 or 1; and u represents an integer of 1 to 3.

Among the monomers represented by the general formulae (I) to (III), more preferable monomers satisfy at least one of the conditions in the general formulae (I) to (III) described below:

J represents —COO— or —CONH—;

K represents a phenylene group or a substituted phenylene group, wherein the substituent is a hydroxide group, a halogen atom, or an alkyl group;

M represents an alkylene group or a divalent connecting group whose molecular formula is $C_nH_{2n}O$, $C_nH_{2n}S$, or $C_nH_{2n+1}N$, wherein n represents an integer of 1 to 12;

$Y_1$ represents a nitrogen atom or a phosphorus atom;

$Y_2$ represents a sulfur atom;

$Z^-$ represents a halogen atom, $PF_6^-$, $BF_4^-$, or $R_8SO_3^-$, wherein $R^8$ represents an alkyl group, an aromatic group, or an aralkyl group each of which has 1 to 10 carbon atoms and may have a substituent;

$R^2$ represents a halogen atom or an alkyl group;

$R^3$, $R^4$, $R^5$, and $R^7$ each independently represent a halogen atom, an alkyl group, an aromatic group, or an aralkyl group each of which has 1 to 10 carbon atoms and may have a substituent;

$R^6$ represents an alkylidyne group which has 1 to 10 carbon atoms and may have a substituent;

$R^3$ and $R^4$, or $R^6$ and $R^7$ each may be bonded to each other to form a ring; and J, k, and m each independently represent 0 or 1, wherein j and k cannot be simultaneously 0.

Among the monomers represented by the general formulae (I) to (III), particularly preferable monomers satisfy at least one of the conditions in the general formulae (I) to (III) described below:

K represents a phenylene group or a substituted phenylene group, wherein the substituent is an alkyl group having 1 to 3 carbon atoms;

M represents an alkylene group having 1 to 2 carbon atoms, or an alkylene group having 1 to 2 carbon atoms and having a terminal oxygen atom which bonds to other groups;

$Z^-$ represents a chlorine ion or $R^8SO_3^-$, wherein $R^8$ represents an alkyl group having 1 to 3 carbon atoms;

$R^2$ represents a hydrogen atom or a methyl group;

j represents 0; and k represents 1.

Specific examples of the monomer having an onium-structure-containing functional group are shown below. However, according to the invention, the monomers having onium-structure-containing functional groups are by no means limited to the examples.

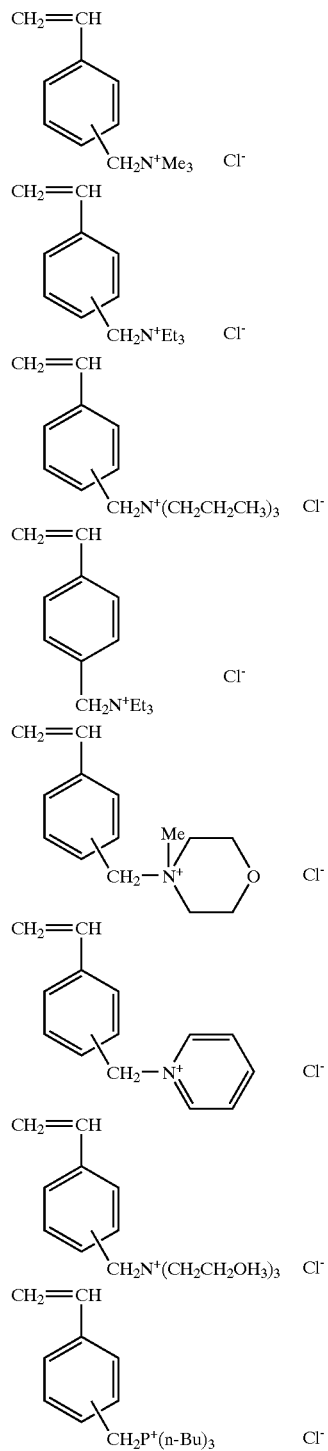

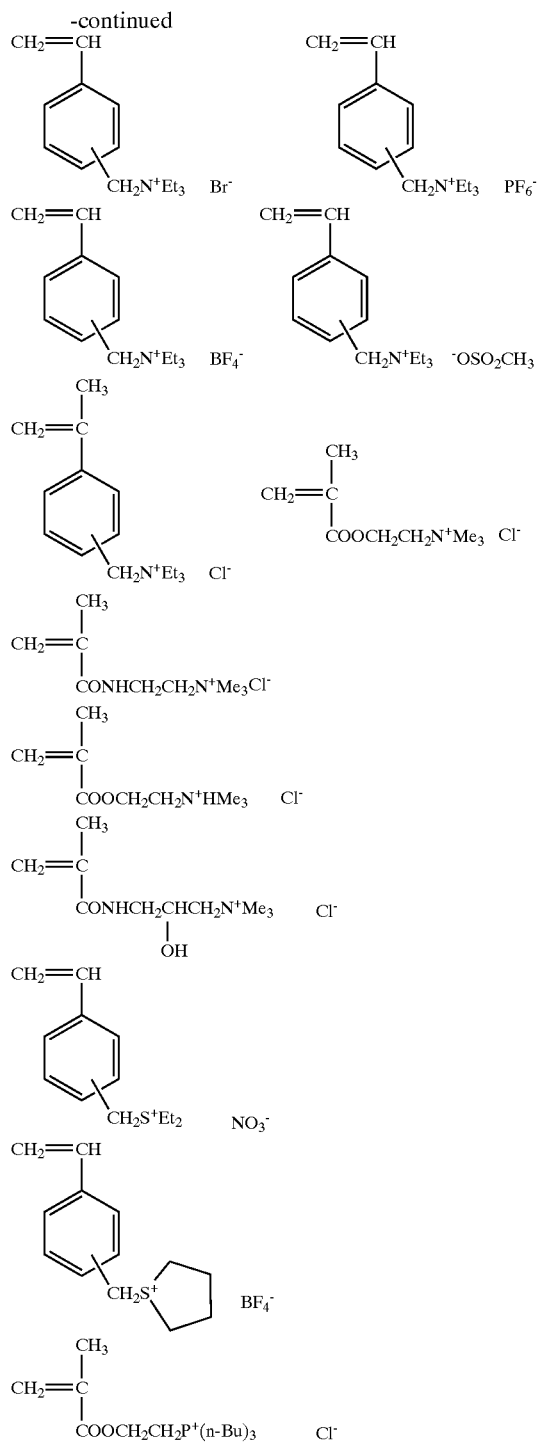

(Specific Monomer Having an Acid Group)

The specific polymer recited in the invention preferably have an acid group in addition to a lactone group, from the viewpoint of improving developability.

Examples of the acid group preferably used in the invention include —COOH, —SO$_3$H, —OSO$_3$H, —PO$_3$H$_2$, —OPO$_3$H$_2$, —CONHSO$_2$, —SO$_2$NHSO$_2$. Among them, —COOH (carboxylic acid group), —SO$_3$H (sulfonic acid group), —PO$_3$H$_2$ (phosphonic acid group) are particularly preferable.

The method of copolymerizing a monomer having an acid group and the monomer having a lactone group may be employed for introducing such an acid group to the specific polymer. The monomer having an acid group may be a monomer having, in a molecule thereof, the acid group and an ethylenic, addition-polymerizable unsaturated group (polymerizable double bond) such as a vinyl group, an allyl group, and a (meth) acrylic group.

(Monomer Having an Acid Group)

Monomers having carboxyl groups, sulfonic acid groups, and phosphonic acid groups, which are acid groups particularly preferably introduced into the specific polymers, are used as examples for explaining the monomer having an acid group. However, the invention is by no means limited to such examples.

Monomer Having a Carboxyl Group

The monomer having a carboxyl group is not particularly restricted so long as a monomer is a polymerizable compound having a carboxyl group and a polymerizable double bond in a structure thereof. Examples of the preferable monomer having a carboxyl group include compounds represented by the general formula (4).

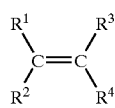

General formula (4)

In the general formula (4), $R^1$ through $R^4$ each independently represent a hydrogen atom, an alkyl group, or an organic group represented by the following general formula (5), wherein at least one of $R^1$ through $R^4$ represent an organic group represented by the following general formula (5).

Preferably, one or two of $R^1$ through $R^4$ represent(s) (an) organic group(s) represented by the general formula (5), and more preferably, one of $R^1$ through $R^4$ represents an organic group represented by the general formula (5), from the viewpoint of the copolymerizability in the production of the specific polymer or availability of the raw materials. Except for that/those represented by the general formula (5), $R^1$ through $R^4$ represent an alkyl group or a hydrogen atom, particularly preferably, a hydrogen atom, from the viewpoint of the flexibility of the specific polymer obtained by polymerization.

For the same reason, if at least one of $R^1$ through $R^4$ represents an alkyl group, the alkyl group is preferably an alkyl group having 1 to 4 carbon atoms, particularly preferably, a methyl group.

—X—COOH    General formula (5)

In the general formula (5), X represents a single bond, an alkylene group, an arylene group which may be substituted, or a group represented by one of the following structural formulae (i) to (iii). From the viewpoint of polymerizability and availability, a single bond, an arylene group whose representative example is a phenylene group, and a group represented by the general formula (i) are preferable, wherein an arylen group and a group represented by the general formula (i) are more preferable and a group represented by the general formula (i) is particularly preferable.

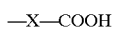

(i)

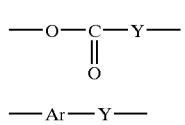

(ii)

—Ar—Y—    (iii)

In the general formulae (i) to (iii), Y represents a divalent connecting group and Ar represents an arylene group which may be substituted. Y preferably represents an alkylene group having 1 to 16 carbon atoms or a single bond. A methylene (—CH$_2$—) in the alkylene group may be substituted by an ether bond (—O—), thioether bond (—S—), an ester bond (—COO—), or an amide bond (—CONR—; R represents a hydrogen atom or an alkyl group), particularly preferably, with an ether bond or an ester bond.

Examples of the divalent connecting group represented by Y are shown below.

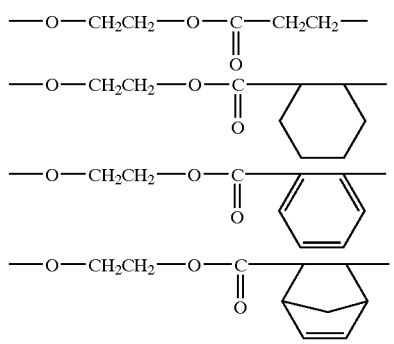

Particularly preferable examples of the copolymerization component having a carboxyl group represented by the general formula (4) are shown below. However, the invention is by no means limited by the examples.

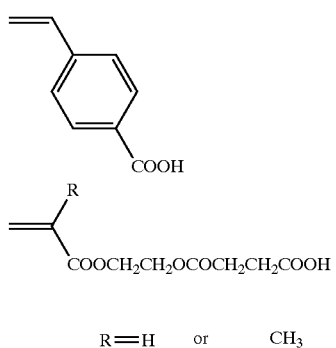

R═H   or   CH$_3$

Monomer Having a Sulfonic Acid Group

The monomer having a sulfonic acid group is not particularly restricted, and any polymerizable compound can be used so long as the polymerizable compound comprises a sulfonic acid group and a polymerizable double bond in a structure thereof. Specific examples of the preferable monomer having a sulfonic acid group include 3-sulfopropyl acrylate, 3-sulfopropyl methacrylate, and 4-stylenesulfonic acid.

Monomer Having a Phosphonic Acid Group

The monomer having a phosphonic acid is not particularly limited, and any polymerizable compound may be used so long as the polymerizable compound comprises a phosphonic group and a polymerizable double bond in a structure thereof.

Specific examples of the preferable monomer having a phosphonic acid include acid phoshoxyethyl methacrylate, 3-chloro-2-acid phosphoxypropyl methacrylate, acid phosphoxypolyoxyethyleneglycol monomethacrylate.

The content of the monomers having acid groups in the specific polymer is preferably 1 to 95% by mol, more preferably, 20 to 80% by mol, most preferably, 30 to 60% by mol.

[Other Monomer Components]

The specific polymer recited in the invention may optionally comprise another monomer component as a copolymer component, for various purposes in accordance with the necessity. As another monomer component, for example, a monomer having a functional group which can interact with the recording layer may be used for improving the interaction with the photosensitive layer.

Specific examples of the monomer having a functional group which can interact with the photosensitive layer are listed below. In the invention, however, the monomer is not limited to these examples.

(1) acrylamides, methacrylamides, acrylic acid esters, methacrylic acid esters and hydroxystyrenes each having an aromatic hydroxyl group, such as N-(4-hydroxyphenyl)acrylamide, N-(4-hydroxyphenyl)methacrylamide, o-, m- or p-hydroxystyrene, o- or m-bromo-p-hydroxystyrene, o- or m-chloro-p-hydroxystyrene, and o-, m- or p-hydroxyphenylacrylate or methacrylate;

(2) unsaturated carboxylic acids, such as acrylic acid, methacrylic acid, maleic acid, maleic anhydride and half esters thereof, itaconic acid, itaconic anhydride and half esters thereof;

(3) acrylamides, such as N-(o-aminosulfonylphenyl)acrylamide, N-(m-aminosulfonylphenyl)acrylamide, N-(p-aminosulfonylphenyl)acrylamide, N-[1-(3-aminosulfonyl)naphthyl]acrylamide and N-(2-aminosulfonylethyl)acrylamide, methacrylamides, such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide and N-(2-aminosulfonylethyl)methacrylamide, unsaturated sulfonamides of acrylic acid esters and the like, such as o-aminosulfonylphenyl acrylate, m-aminosulfonylphenyl acrylate, p-aminosulfonylphenyl acrylate and 1-(3-aminosulfonylphenylnaphtyl)acrylate, unsaturated sulfonamides of methacrylic acid esters and the like, such as o-aminosulfonylphenyl methacrylate, m-aminosulfonylphenyl methacrylate, p-aminosulfonylphenyl methacrylate and 1-(3-aminosulfonylphenylnaphtyl)methacrylate;

(4) phenylsulfonylacrylamides which may have a substituent, such as tosylacrylamide, and phenylsulfonylmethacrylamides which may have a substituent, such as tosylmethacrylamide;

(5) acrylic acid esters and methacrylic acid esters each having an aliphatic hydroxyl group, such as 2-hydroxyethyl acrylate and 2-hydroxyethyl methacrylate;

(6) acrylic acid ester (which may be substituted), such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N-dimethylaminoethyl acrylate;

(7) methacrylic acid esters (which may be substituted), such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, and N-dimethylaminoethyl methacrylate;

(8) acrylamides or methacrylamides, such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide;

(9) vinyl ethers, such as ethyl vinyl ether, 2-chloroethyl vinyl ether, hydroxyethyl vinyl ether, propyl vinyl ether, butyl vinyl ether, octyl vinyl ether, and phenyl vinyl ether;

(10) vinyl esters, such as vinyl acetate, vinyl chloroacetate, vinyl butyrate, and vinyl benzoate;

(11) styrenes, such as styrene, a-methylstyrene, methylstyrene, and chloromethylstyrene;

(12) vinyl ketones, such as methyl vinyl ketone, ethyl vinyl ketone, propyl vinyl ketone, and phenyl vinyl ketone;

(13) olefins, such as ethylene, propylene, isobutylene, butadiene, and isoprene;

(14) N-vinylprrolidone, N-vinylcarbazole, 4-vinylpyridine, acrylonitrile, and methacrylonitrile;

(15) lactone group-containing monomers, such as pantoyllacton (meth)acrylate, α-(meth)acryloyl-γ-butyrolactone, and β-(meth)acryloyl-γ-butyrolactone; and

(16) ethylene oxide group-containing monomers, such as polyethylene glycol mono(meth)acrylate, polypropylene glycol mono(meth)acrylate, and methoxypolyethylene glycol mono(meth)acrylate.

The content of the other monomers in the specific polymer is preferably 30% by mol or less.

Specific examples of the preferable specific polymer recited in the invention are shown below. However, according to the invention, the specific polymer recited in the invention is by no means limited to the examples.

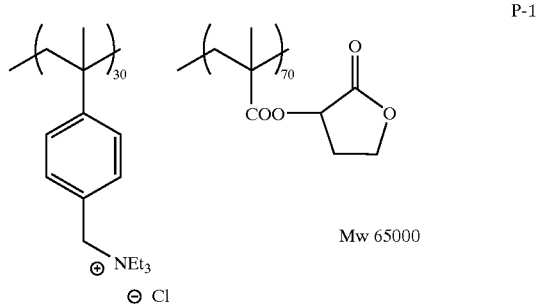

P-1

Mw 65000

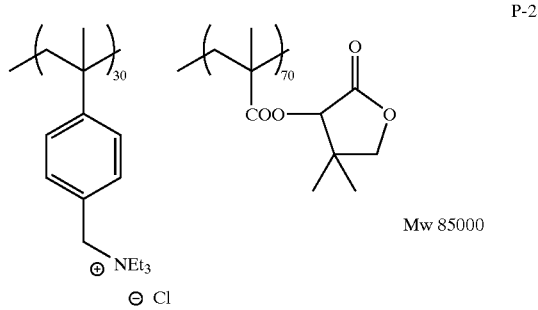

P-2

Mw 85000

-continued
P-3
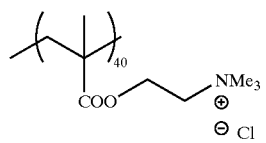 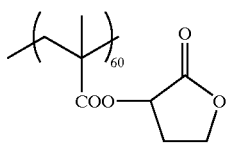
Mw 45000
P-4
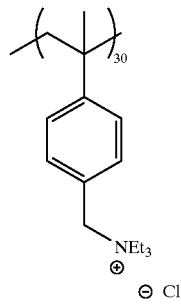
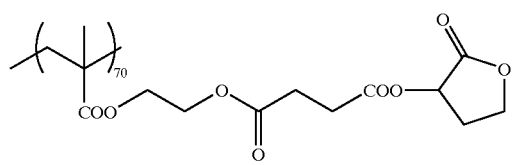
Mw 68000
P-5
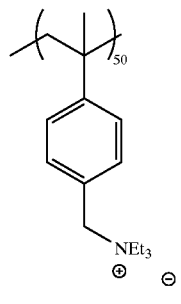 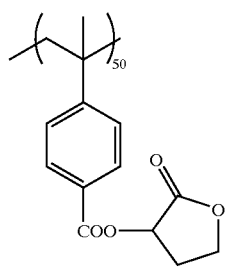
Mw 41000
P-6
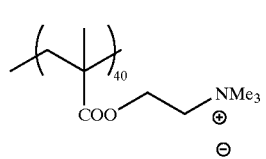 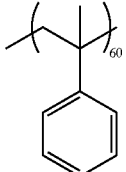
Mw 56000
P-7
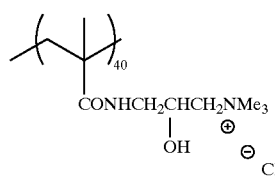 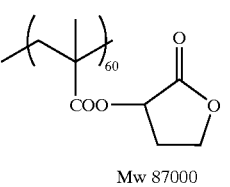
Mw 87000
-continued
P-8
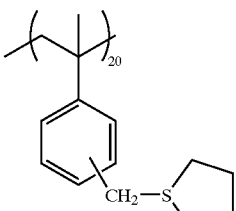
Mw 75000
P-9
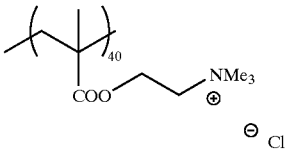
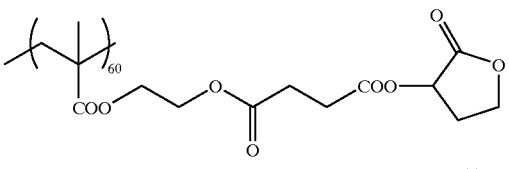
Mw 55000
P-10
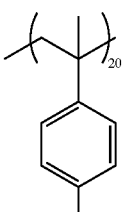
Mw 43000
P-11
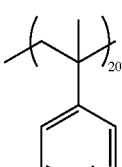
Mw 81000
P-12
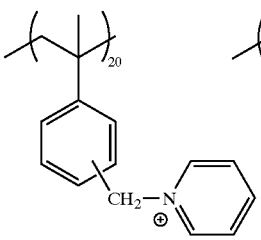
Mw 72000

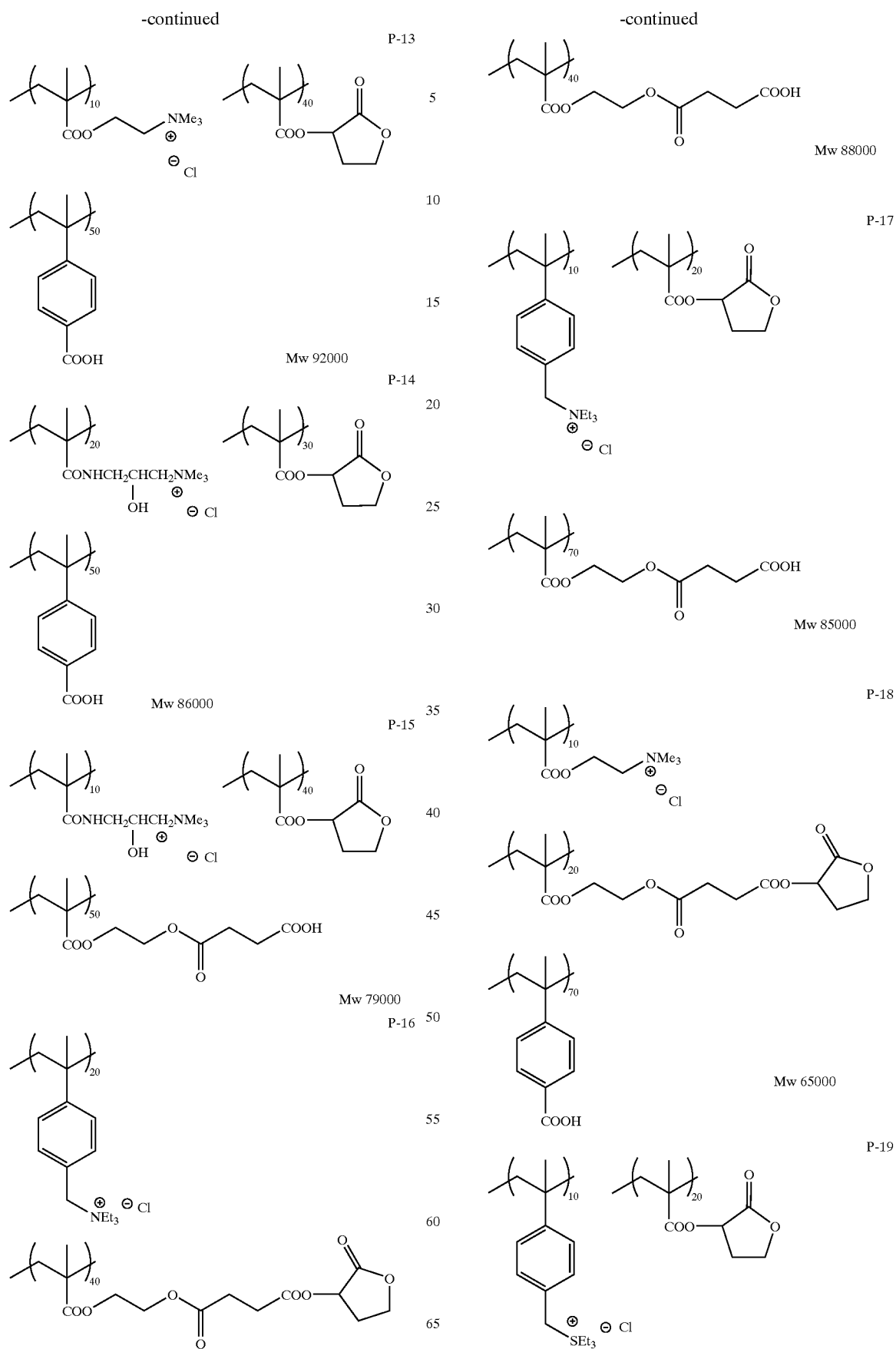

-continued

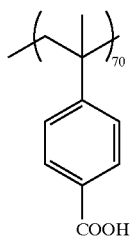

Mw 66000

P-20

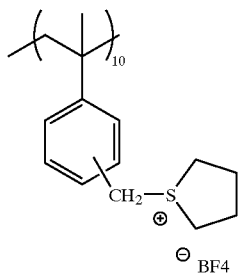 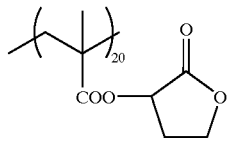

Mw 88000

P-21

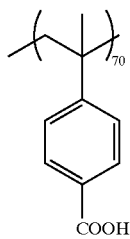

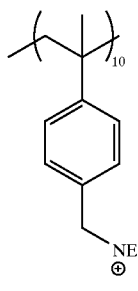 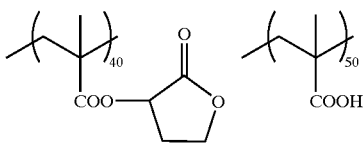

Mw 66000

P-22

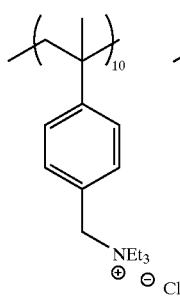

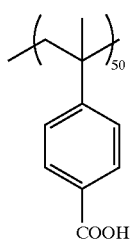

Mw 96000

(Application of the Intermediate Layer)

The above-mentioned respective components of the intermediate layer in the invention can be applied onto a support, which will be detailed later, by any one of various methods, so as to form the intermediate layer on the support. The method of applying the intermediate layer is not particularly limited, typical examples of which include methods described below.

A method of applying, to a support, a solution in which the specific polymer in the invention is dissolved in an organic solvent such as methanol, ethanol or methyl ethyl ketone, a mixed solvent thereof, or a mixed solvent of at least one of these organic solvents and water, and then drying the formed layer to form an intermediate layer; or a method of immersing a support into a solution in which the specific polymer in the invention is dissolved in an organic solvent such as methanol, ethanol or methyl ethyl ketone, a mixed solvent thereof, or a mixed solvent of at least one of these organic solvents and water, washing the support with water, air or the like, and then drying the formed layer to form an intermediate layer, can be cited as examples.

In the former method, the solution in which the total concentration of the above-mentioned compounds is from 0.005 to 10% by mass can be applied employing any one of various coating methods. The coating method may be any method including bar coater coating, rotary coating, spray coating, and curtain coating. In the latter method, the total concentration of the above-mentioned compounds in the solution is from 0.005 to 20% by mass, preferably from 0.01 to 10% by mass, and the dipping temperature is from 0 to 70° C., preferably from 5 to 60° C. The dipping time is from 0.1 second to 5 minutes, preferably from 0.5 to 120 seconds.

The pH of the above-mentioned solution can be adjusted with a basic substance such as ammonia, triethylamine or potassium hydroxide; an inorganic acid such as hydrochloric acid, phosphoric acid, sulfuric acid, or nitric acid; an organic sulfonic acid such as nitrobenzenesulfonic acid or naphthalenesulfonic acid; an organic phosphonic acid such as phenylphosphonic acid; an organic carboxylic acid such as benzoic acid, coumaric acid or malic acid; some other organic acidic substance; an organic chloride such as naphthalenesulfonyl chloride or benzenesulfonyl chloride, so that the solution can be used within the range of pH=0 to 12, preferably pH=0 to 6. A substance which absorbs ultraviolet rays, visible rays or infrared rays can be added to the solution in order to improve the tone reproducibility of the photosensitive planographic printing plate.

In the invention, the total amount of the applied intermediate layer after the intermediate layer is dried is properly from 1 to 100 mg/m², preferably from 2 to 70 mg/m².

[Recording Layer]

The kind of the recording layer used in the invention is not particularly limited, and various known recording layers for planographic printing plate precursors can be used. Typical examples thereof include recording layers such as photosensitive layers and thermosensitive layers, whose specific and preferred examples include conventional positive type, conventional negative type, photopolymer type, thermal positive type, thermal negative type, and non-treated type recording layers. The following will describe these preferred recording layers.

<Conventional Positive Type>

A preferred example of a photosensitive resin composition of the conventional positive type is a composition containing o-quinonediazide compound and an alkali soluble polymer compound.

Examples of the o-quinoneazide compound include esters of 1,2-naphthoquinone-2-diazide-5-sulfonylchloride with phenol/formaldehyde resin or cresol/formaldehyde resin, and esters of 1,2-naphthoquinone-2-diazide-5-sulfonylchloride with pyrogallol/acetone resin, which is described in U.S. Pat. No. 3,635,709.

Examples of the alkali soluble polymer compound include phenol/formaldehyde resin, cresol/formaldehyde resin, phenol/cresol/formaldehyde copolycondensation resin, polyhydroxystyrene, N-(4-hydroxyphenyl)methacrylamide copolymer, and carboxy group-containing polymer described in JP-A No. 7-36184. Various alkali soluble polymer compounds, such as acrylic resin which contains a phenolic hydroxyl group as described in JP-A No. 51-34711, and acrylic resin or urethane resin which has a sulfonamide group as described in JP-A No. 2-866 can also be used.

It is preferred to add, to the conventional positive type photosensitive resin composition, compounds such as a sensitivity adjuster, a printing-out agent, and a dye, described in paragraphs [0024] to [0027] in JP-A No. 7-92660, or a surfactant for improving the coating property, as described in paragraph [0031] in the same publication.

<Conventional Negative Type>

An example of a photosensitive resin composition of the conventional negative type is a composition containing a diazo resin and an alkali soluble or swelling polymer compound (binder).

Examples of the diazo resin include condensates of an aromatic diazonium salt and an active carbonyl group-containing compound such as formaldehyde, and organic solvent soluble diazo resin inorganic salts, which are products resulting from reaction of a condensate of a p-diazophenylamine and formaldehyde with a hexafluorophosphoric acid salt or a tetrafluoroboric acid salt. Polymer diazo compounds containing at least 20% by mol of multimers which each comprise at least six monomers, described in JP-A No. 59-78340, are particularly preferable.

Preferred examples of the binder include copolymers which contain acrylic acid, methacrylic acid, crotonic acid or maleic acid as an essential component. Specific examples thereof include multi-component copolymers including monomers such as 2-hydroxyethyl(meth)acrylate, (meth)acrylonitrile, and (meth)acrylic acid, as described in JP-A No. 50-118802; and multi-component polymers including alkyl acrylate, (meth)acrylonitrile, and unsaturated carboxylic acid, as described in JP-A No. 56-4144.

It is preferred to add, to the conventional positive type photosensitive resin composition, such compounds as a printing-out agent, a dye, a plasticizer for giving flexibility or wearresistance to films, a development promoter, or a surfactant for improving the coating property, described in paragraphs [0014] to [0015] in JP-A No. 7-281425.

It is preferred to provide, as an underlying layer of the above-mentioned conventional positive or negative type recording layer, an intermediate layer containing a polymer compound which includes a component having an acid group and a component having an onium-structure-containing organic group, described in JP-A No. 2000-105462.

<Photopolymer Type>

(Recording Layer)

A photopolymerizable photosensitive composition of the photopolymer type, (which is referred to as a "photopolymerizable composition" hereinafter), contains an ethylenic unsaturated bond-containing compound that is addition-polymerizable, (which is referred to merely as an "ethylenic unsaturated bond-containing compound" hereinafter), a photopolymerization initiator and a polymer binder as essential components and optionally contains various compounds such as a colorant, a plasticizer, and a thermopolymerization inhibitor.

The ethylenic unsaturated bond-containing compound contained in the photopolymerizable composition is a compound having an ethylenic unsaturated bond which is addition-polymerized, crosslinked and cured, by effect of the photopolymerization initiator when the photopolymerizable composition is irradiated with an active light ray. The ethylenic unsaturated bond-containing compound can be arbitrarily selected from compounds having at least one terminal ethylenic unsaturated bond, preferably two or more terminal ethylenic unsaturated bonds, and takes the chemical form of a monomer, a prepolymer (that is, dimer, trimer, or oligomer), a mixture thereof or a copolymer thereof, or in some other chemical form. Examples of the monomer include an ester of an unsaturated carboxylic acid (such as acrylic acid, methacrylic acid, itaconic acid, crotonic acid, isocrotonic acid or maleic acid) with an aliphatic polyhydric alcohol compound, and an amide of an unsaturated carboxylic acid with an aliphatic polyhydric amine compound. Urethane-based addition-polymerizable compounds are also preferred.

The initiator contained in the photopolymerizable composition can be appropriately selected from various photopolymerization initiators and combination systems of two or more photopolymerization initiators (photo initiator systems), depending on the wavelength of a light source to be used. For example, initiator systems described in paragraphs [0021] to [0023] in JP-A No. 2001-22079 are preferred.

As the polymer binder contained in the photopolymerizable composition, alkali water soluble or swelling organic polymers are used since the binder, which functions as an agent for forming the film of the photopolymerizable composition, must cause the dissolution of the recording layer in alkali developer. As the polymers, polymers described in paragraphs [0036] to [0063] in the same publication are useful. It is also preferred to add additives (for example, a surfactant for improving the coating property) disclosed in paragraphs [0079] to [0088] in the same publication to the photopolymerizable composition.

In order to prevent the polymerization inhibiting effect of oxygen, it is also preferred to provide an oxygen-blocking protective layer on or over the recording layer. Examples of the polymer contained in the oxygen-blocking protective layer are polyvinyl alcohol and copolymers thereof.

<Thermal Positive Type>

(Thermosensitive Layer)

A thermosensitive layer of the thermal positive type contains an alkali soluble polymer compound and a photo-thermal conversion substance.

Preferred examples of the alkali soluble polymer compound include homopolymers containing an acidic group in the polymers, copolymers thereof, and mixtures thereof. From the viewpoint of solubility in alkali developer, particularly preferred are polymer compounds having an acidic group as described in the following (1) or (2): (1) a phenolic hydroxyl group (—Ar—OH), and (2) a sulfonamide group (—SO$_2$NH—R). Above all, it is preferred that the polymer compounds have a phenolic hydroxyl group from the viewpoint of the superior in image forming property when exposed with an infrared ray laser or the like. Specific examples of the preferred polymer compounds include Novolak resins, such as phenol formaldehyde resin, m-cresol formaldehyde resin, p-cresol formaldehyde resin, m-/p-mixed cresol formaldehyde resin, and phenol/(m-, p- or m-/p-mixed) cresol mixed formaldehyde resin; and pyrogallol acetone resin. More specifically, polymers described in paragraphs [0023] to [0042] in JP-A No. 2001-305722 are preferably used.

The photothermal conversion substance makes it possible to convert exposure energy to heat and attain an efficient interaction cancellation in exposed portions of the thermosensitive layer. From the viewpoint of recording sensitivity, a pigment or dye having a light absorption wavelength within an infrared ray range which corresponds to wavelengths of 700 to 1200 nm is preferred. Specific examples of the dye include azo dyes, metal complex salt azo dyes, pyrrozolone azo dyes, naphthoquinone dyes, anthraquinone dyes, phthalocyanine dyes, carbonium dyes, quinoneimine dyes, methine dyes, cyanine dyes, squarylium dyes, pyrylium dyes, and metal thiolate complexes (for example, a nickel thiolate complex). Particularly preferred are cyanine dyes, for example, cyanine dyes represented by the general formula (I) in JP-A No. 2001-305722 can be cited. It is preferred to add, to the thermal positive type composition, the same sensitivity adjustor, printing-out agent, dye, surfactant for improving the application performance, and other compounds, similarly to the case of the above-mentioned conventional positive type. Specifically, compounds described in paragraphs [0053] to [0059] in JP-A No. 2001-305722 are preferred.

The thermosensitive layer of the thermal positive type may have a monolayer structure, or a bilayer structure as described in JP-A No. 11-218914.

<Thermal Negative Type>
(Thermosensitive Layer)

A thermosensitive layer of the thermal negative type is a negative type thermosensitive layer, wherein, when exposed with infrared ray laser, the radiated portions are cured to form image portions.

A preferred example of such a thermal negative type thermosensitive layer is a polymerizable type layer. The polymerizable layer contains (A) an infrared ray absorbing agent, (B) a radical generator (radical polymerization initiator), (C) a radical polymerizable compound which undergoes polymerization reaction due to generated radicals so as to be cured, and (D) a binder polymer.

In the polymerizable layer, infrared rays which the infrared ray absorbing agent absorbs are converted to heat, and the heat generated at this time causes the radical polymerization initiator such as an onium salt to be decomposed, so as to generate radicals. The radical polymerizable compound is selected from compounds having a terminal ethylenic unsaturated bond, and undergoes polymerization chain reaction by the generated radicals, so that the compound is cured.

The infrared ray absorbing agent (A) is, for example, the above-mentioned photothermal conversion material contained in the above-mentioned thermal positive type thermosensitive layer. Specific examples of the cyanine dye include dyes described in paragraphs [0017] to [0019] in JP-A No. 2001-133969.

The radical generator (B) is, for example, an onium salt. Specific examples of the onium salt which is preferably used include salts described in paragraphs [0030] to [0033] in JP-A No. 2001-133969.

The radical polymerizable compound (C) is selected from compounds having one or more (preferably 2 or more) terminal ethylenic unsaturated bonds.

The binder polymer (D) is preferably a linear organic polymer, and is selected from linear organic polymers soluble or swelling in water or alkalescent water. Among these polymers, (meth)acryl resins having a benzyl group or an allyl group, and a carboxyl group on the side chain are preferable, since the resin is superior in balance of film strength, sensitivity and developing property.

As the radical polymerizable compound (C) and the binder polymer (D), materials described in paragraphs [0036] to [0060] in the same publication can be used. As other additives, additives (for example, a surfactant for improving the application performance) described in paragraphs [0061] to [0068] are preferably used.

A preferred example of the thermal negative type thermosensitive layer is an acid crosslinkable type layer besides the polymerizing type layer.

The acid crosslinkable layer contains (E) a compound which can generate an acid due to light or heat, (referred to as an "acid generator" hereinafter), and (F) a compound which can be crosslinked by the generated acid, (referred to as a "crosslinking agent"), and further contains (G) an alkali soluble polymer compound which can react with the crosslinking agent in the presence of the acid. In order to use the energy of an infrared ray laser effectively, the infrared ray absorbing agent (A) is incorporated into the acid crosslinkable layer.

The acid generator (E) may be a compound which can be thermally decomposed to generate an acid, examples of which include a photo initiator for photopolymerization, a photo alterant for dyes, an acid generator used in microresists.

Examples of the crosslinking agent (F) include (i) aromatic compounds substituted by a hydroxymethyl group or an alkoxymethyl group, (ii) compounds having an N-hydroxymethyl, N-alkoxymethyl or N-acyloxymethyl group, and (iii) epoxidized compounds. Examples of the alkali soluble polymer compound (G) include Novolak resin, and polymer having a hydroxyaryl group on its side chain.

<Non-treated Type>

A thermosensitive layer of the non-treated type is classified to a thermoplastic fine particle polymer type, a microcapsule type, and a sulfonic acid-generating polymer containing type. The invention is particularly suitable for a non-treated type which is developed on a printing machine.

Thermoplastic Fine Particle Polymer Type

In the thermoplastic fine particle polymer type, hydrophobic heat-meltable resin fine particles (H) are dispersed in a hydrophilic polymer matrix. And at exposure, the hydrophobic polymer is melted by heat in exposed portions, so that the melted polymer portions are fused to each other. As a result, hydrophobic portions made of the polymer, namely, image portions are formed. The hydrophobic heat-fusable resin fine particles (H), referred to as the "polymer fine particles" hereinafter, are preferably fused and combined with each other by heat, and the particles (H) are more preferably particles which have hydrophilic surfaces and can be dispersed in a hydrophilic component such as moistening-water.

Preferred examples of the polymer fine particles include thermoplastic polymer fine particles described in Research Disclosure No. 33303 (January in 1992), JP-A Nos. 9-123387, 9-131850, 9-171249 and 9-171250, EP No. 931, 647, etc. Specific examples thereof include homopolymers and copolymers of monomers such as ethylene, styrene, vinyl chloride, methyl acrylate, ethyl acrylate, methyl methacrylate, ethyl methacrylate, vinylidene chloride, acrylonitrile, and vinyl carbazole; and mixtures thereof. Particularly preferred are polystyrene and polymethyl methacrylate.

The polymer fine particles having hydrophilic surfaces include, as examples thereof, substances in which polymers are themselves hydrophilic, such as substances in which polymers constituting fine particles are themselves hydrophilic, or substances to which hydrophilicity is imparted by introducing hydrophilic groups into the main chains or side chains of polymers; and substances whose surfaces are made hydrophilic by allowing a hydrophilic polymer, a hydrophilic oligomer or a hydrophilic low molecular weight compound, such as polyvinyl alcohol or polyethylene glycol, to be adsorbed on the surfaces of polymer fine particles. As the polymer fine particles, polymer fine particles having reactive functional groups are more preferred.

By dispersing polymer fine particles as described above into the hydrophilic polymer matrix (J), the on-machine developing property is made better in the case of on-machine development and further the film strength of the thermosensitive layer itself is also improved.

Microcapsule Type

Preferred examples of the microcapsule type include a type described in JP-A No. 2000-118160; and a microcapsule type in which a compound having a thermally reactive functional group is encapsulated as described in JP-A No. 2001-277740.

Sulfonic Acid-generating Polymer Containing Type

Examples of the sulfonic acid-generating polymer include polymers having, on the side chains thereof, sulfonic acid ester groups, disulfonic groups or sec- or tert-sulfonamide groups, described in JP-A No. 10-282672.

By incorporating hydrophilic resin into the non-treated type thermosensitive layer, the on-machine developing property is improved and further the film strength of the thermosensitive layer itself is also improved. Moreover, the hydrophilic resin can be crosslinked and cured so that a planographic printing plate precursor for which no development treatment is required is obtained.

Preferred examples of the hydrophilic resin include resin having a hydrophilic group such as a hydroxyl, carboxyl, hydroxylethyl, hydroxylpropyl, amino, aminoethyl, aminopropyl, or carboxylmethyl group; and hydrophilic sol-gel convertible binder resin. Specific examples of the hydrophilic resin are the same as described as examples of the hydrophilic resin used as the hydrophilic polymer matrix (J) which is used in the photo polymer type recording layer. In the non-treated type thermosensitive layer, it is preferred to use the sol-gel convertible binder resin among the hydrophilic resins.

It is necessary to add a photothermal conversion material to the non-treated type thermosensitive layer. The photothermal conversion material may be any material which can absorb light having a wavelength of 700 nm or more. Particularly preferred are the same dyes which can absorb infrared rays as used in the above-mentioned thermal positive type.

The recording layer in the invention can be provided by applying, onto a support, a solution in which desired components for the recording layer are dissolved in a solvent, for example, a coating solution for the above-mentioned image forming layer (recording layer).

Examples of the solvent used in the coating solution include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolatone, and toluene. In the case of using a water soluble recording layer, examples of the solvent are aqueous solvents such as water and alcohols. However, the kind of the solvent is not limited to these examples, and the solvent may be appropriately selected in accordance with physical properties of the image forming layer. These solvents are used alone or in the form of a mixture thereof. The concentration of the above-mentioned respective components (all solid contents including the additives) in the solvent is preferably from 1 to 50% by mass.

The application amount (of all the solid contents) on the support after the solution is applied and dried varies depending on the use. Regarding a planographic printing plate, in general, the application amount is preferably from 0.5 to 5.0 g/m². As the application amount gets smaller, the apparent sensitivity increases, however the membrane property of the recording layer gets worse.

The method of the application may be any one selected from various methods, including bar coater coating, rotation coating, spray coating, curtain coating, dip coating, air knife coating, blade coating and roll coating.

[Other Layers]

The planographic printing plate precursor of the invention may appropriately include not only the intermediate layer and the recording layer but also other layers such as an overcoat layer and a back coat layer in accordance with a desired property. Preferred examples of the back coat layer include coat layers made of an organic polymer compound described in JP-A No. 5-45885 and coat layers made of a metal oxide obtained by hydrolyzing and polycondensating an organic or inorganic metal compound, described in JP-A No. 6-35174. Among these coat layers, particularly preferred is the coat layer made of the metal oxide obtained from an alkoxyl compound of silicon, such as $Si(OCH_3)_4Si(OC_2H_5)_4$, $Si(OC_3H_7)_4$ or $Si(OC_4H_9)_4$, which is inexpensive and easily available, since the coat layer is superior in development resistance.

[Support]

Regarding the support used in the invention, it is necessary to use, as its base material, a plate-form material suitable for the use in planographic printing plate precursors and dimensionally stable. The base material can be arbitrarily selected from materials having required properties such as strength, endurance and flexibility. Since the base material may be subjected to treatment of imparting hydrophilicity to the surface thereof or treatment of forming a hydrophilic layer thereon, the base material is preferably suitable for such treatments.

[Base Material]

Examples of the base material used in the planographic printing plate precursor of the invention include plastic (such as polyethylene, polypropylene or polystyrene)-laminated papers, metal plates (such as aluminum, zinc and copper plates), plastic films (such as cellulose biacetate, cellulose triacetate, cellulose propionate, cellulose lactate, cellulose acetate lactate, cellulose nitrate, polyethylene terephthalate, polyethylene, polystyrene, polypropylene, polycarbonate, and polyvinyl acetate films), and papers or plastic films on which a metal as described above is laminated or vapor-deposited.

The base material used in the invention is preferably a polyester film or an aluminum plate, and is more preferably an aluminum plate since it is superior in dimensional stability and is relatively inexpensive.

Particularly preferred examples of the aluminum plate include a pure aluminum plate and alloy plates mainly comprised of aluminum and including a trace amount of different elements. A plastic film on which aluminum is laminated or vapor-deposited may be used. The different elements contained in the aluminum alloys are silicon, iron, manganese, copper, magnesium, chromium, zinc, bismuth, nickel, titanium and so on. The content by percentage of the different elements in the alloy is at most 10% by mass. A particularly preferred aluminum plate in the invention is a pure aluminum plate; however, a trace amount of the different elements may be contained in the plate since completely pure aluminum is hard to produce from the viewpoint of refining techniques.

The composition of the aluminum plate used in the invention is not particularly specified. Thus, aluminum plates which have been known or used hitherto can be appropriately used. The thickness of the aluminum plate used in the invention is from about 0.1 to 0.6 mm, preferably from 0.15 to 0.4 mm, and most preferably from 0.2 to 0.3 mm.

If necessary, the aluminum plate used as the base material may be subjected to surface treatment such as surface-roughening treatment or anode-oxidizing treatment. Such surface treatment will be briefly described hereinafter.

Before the surface of the aluminum plate is roughened, the plate is, if desired, subjected to degreasing treatment to remove rolling oil on the surface with a surfactant, an organic solvent, an aqueous alkali solution, or the like. Thereafter, the roughening treatment of the aluminum surface is performed, for example, by a mechanical surface-roughening method, a method of dissolving and roughening the surface electrochemically, a method of dissolving the surface selectively in a chemical manner, or some other method. The mechanical surface-roughening method which can be used may be a known method, such as a ball polishing method, brush polishing method, a blast polishing method or a buff polishing method. The electrochemical surface-roughening method may be a method of performing surface-roughening in a hydrochloric acid or nitric acid electrolyte by alternating current or direct current. As disclosed in JP-A No. 54-63902, a combination of the two may be used.

The aluminum plate whose surface is roughened as described above is subjected to alkali-etching treatment and neutralizing treatment if necessary. Thereafter, the aluminum plate is subjected to anode-oxidizing treatment if desired, in order to improve the water holding capacity or wear resistance of the surface. The electrolyte used in the anode-oxidizing treatment of the aluminum plate is any one selected from various electrolytes which can form a porous oxide film. Sulfuric acid, phosphoric acid, oxalic acid, chromic acid, or a mixed acid thereof is generally used. The concentration of the electrolyte may be appropriately decided depending on the kind of the electrolyte.

Treatment conditions for the anode-oxidation cannot be specified uniquely since the conditions vary depending on the used electrolyte; however, the following conditions are generally suitable: an electrolyte concentration of 1 to 80% by mass, a solution temperature of 5 to 70° C., a current density of 5 to 60 A/dm$^2$, a voltage of 1 to 100 V, and an electrolyzing time of 10 seconds to 5 minutes. The amount of the oxide film on anode is preferably 1.0 g/m$^2$ or more, more preferably from 2.0 to 6.0 g/m$^2$. If the amount is less than 1.0 g/m$^2$, the printing durability is insufficient or non-image portions of the planographic printing plate are easily scared so that the so-called "scar blemishes", resulting from ink adhesion to scared portions at printing, are easily generated. Such anode-oxidizing treatment is applied to the printing-face of the support of the planographic printing plate. In general, however, an oxide film on anode having an amount of 0.01 to 3 g/m$^2$ is formed on the back face by the bypassing of electric force lines.

In the case of using a plastic film, such as a polyester film, as another preferred embodiment, it is preferred to roughen the face on which the hydrophilic surface is to be formed, from the viewpoint of the formability of the hydrophilic surface or the adhesiveness to the intermediate layer formed on the hydrophilic surface.

As such a surface-roughening method, various known methods can be adopted. Examples thereof include a method of rubbing the surface of the base material mechanically by sandblast working or brush working, so as to grind the surface and form fine concave portions, thereby roughening the surface; a method of forming irregularities by mechanical embossing working; a surface-roughening method of forming fine convex portions on the surface in a gravure printing or the like; a method of roughening the surface of the base material itself by physical treatment; and a method of forming a layer containing solid fine particles (mat agent) on the surface of the base material by such a method as coating or printing, so as to roughen the surface. At the stage of forming a plastic film, the solid fine particles may be incorporated into the material of the plastic, and at the time of shaping it into a film form, irregularities can be formed in the surface thereof. Furthermore, a known surface treatment method such as solvent treatment, corona discharge treatment, plasma treatment, electron beam irradiating treatment or X-ray irradiating treatment may be employed for roughening the surface. These methods may be used alone or in combination.

Particularly preferred are the method of sandblasting, the method of making the surface rough by printing a resin, and the method of adding solid fine particles to the film material to form irregularities.

[Hydrophilic Surface]

The support used in the invention may be a support in which a hydrophilic surface is formed on the base material. Preferably, such a hydrophilic surface is formed after the above-mentioned anode-oxidizing treatment. The surface can be formed by a known method.

The hydrophilic surface forming method which can be used in the invention may be an alkali metal silicate (form example, aqueous sodium silicate solution) method, as disclosed in U.S. Pat. Nos. 2,714,066, 3,181,461, 3,280,734, and 3,902,734. In this method, the support is subjected to immersing treatment or electrolyzing treatment with aqueous sodium silicate solution. Besides, a method of treating the support with potassium fluorozirconate disclosed in JP-B No. 36-22063 or a method of treating the support with polyvinyl phosphonic acid, disclosed in U.S. Pat. Nos. 3,276,868, 4,153,461, and 4,689,272, or a method of bonding a hydrophilic polymer chemically to the support surface are preferable.

Among these methods, the method of forming the hydrophilic surface by alkali metal silicate treatment or the method of bonding a hydrophilic polymer chemically to the support surface are preferred.

(Formation of the Hydrophilic Surface by Alkali Metal Silicate Treatment)

The following will describe the method of forming the hydrophilic surface by subjecting the support surface with alkali metal silicate treatment in detail.

In the invention, the above-mentioned aluminum plate on which the oxide film on anode has been provided is subjected to alkali metal silicate treatment, whereby the hydrophilic surface can be formed on the aluminum support.

The alkali metal silicate treatment is preferably conducted by immersing the oxide film on anode of the aluminum plate treated as described above into an aqueous solution having an alkali metal silicate concentration of 0.01 to 30% by mass (preferably 0.1 to 5% by mass) and a pH of 10 to 13 measured at 25° C., at, for example, 10 to 90° C. for 0.5 to 40 seconds, preferably 1 to 20 seconds. If the pH of the aqueous alkali metal silicate solution is lower than 10, the solution turns into gel. If the pH is higher than 13, the oxide film is dissolved.

The alkali metal silicate used in the invention may be sodium silicate, potassium silicate, lithium silicate or the like. Sodium silicate and potassium silicate are preferable. A hydroxide used to heighten the pH of the aqueous alkali metal silicate solution is sodium hydroxide, potassium hydroxide, lithium hydroxide or the like. Sodium hydroxide and potassium hydroxide are preferable. It is allowable to incorporate an alkali earth metal salt or a IVB group metal salt into the above-mentioned treating solution. Examples of the alkali earth metal salt include nitrates such as calcium nitrate, strontium nitrate, magnesium nitrate and barium nitrate; sulfates; hydrochlorides; phosphates; acetates; oxalates; and borates. Examples of the IVB group metal salts include titanium tetrachloride, titanium trichloride, titanium potassium fluoride, titanium potassium oxalate, titanium sulfate, titanium tetraiodide, zirconium oxide chloride, zirconium dioxide, zirconium oxychloride, and zirconium tetrachloride. The alkali earth metal salts or the IVB group metal salts may be used alone or in combination of two or more thereof.

(Formation of the Hydrophilic Surface by Bonding Hydrophilic Polymer Chemically to the Support Surface)

The following will describe in detail the method of bonding a hydrophilic polymer chemically to the support surface to form the hydrophilic surface.

This method is characterized by bonding hydrophilic polymer having at least one of a reactive group which can be chemically bonded directly to the base material surface and a reactive group which can be chemically bonded to the base material surface through a component having a crosslinking structure, so as to yield the hydrophilic surface. Hereinafter, the polymer may be referred to the "specific hydrophilic polymer" in some cases. First, the specific hydrophilic polymer will be described.

As the specific hydrophilic polymer, any hydrophilic polymer which has, at its terminal or on its side chain, a reactive group which can be chemically bonded to the base material surface directly or through a component having a crosslinking structure and which has a hydrophilic functional group can be used without particular limitation.

This specific hydrophilic polymer is preferably a polymer having a crosslinking group, such as an alkoxy group, as the reactive group. This crosslinking group may be bonded directly to —$Al^{3+}$, or a functional group (such as —OH) present on the base material surface by coupling reaction, or may be bonded to the base material through a crosslinked structure formed by preparing a hydrophilic coating-solution which contains the specific hydrophilic polymer, applying the coating-solution to the base material surface, drying the applied solution, and thus hydrolyzing and polycondensing the crosslinking group. The crosslinked structure as formed in the latter embodiment is a preferred embodiment in the invention since the crosslinked structure makes it possible to form a firm and durable hydrophilic surface easily. In the present specification, such a crosslinked structure will be hereinafter referred to as a "sol-gel crosslinked structure" in some cases.

The crosslinking group is preferably an alkoxide compound containing an element selected from Si, Ti, Zr, and Al, and more preferably an alkoxide of Si because of its high reactivity and easy availability. Specifically, a compound which can be used as a silane coupling agent is preferred.

Regarding preferred embodiments of the hydrophilic surface obtained by the present hydrophilicity-imparting treatment, the construction thereof and the method of forming the hydrophilic surface will be described in detail hereinafter.

<Hydrophilic Polymer Having a Reactive Group Which Can be Chemically Bonded to the Base Material Surface Directly or Through a Component Having a Crosslinking Structure>

As the hydrophilic polymer having, at its terminal or on its side chain, a reactive group which can be chemically bonded to the base material surface directly or through a component having a crosslinking structure (i.e., the specific hydrophilic polymer), any polymer having, in the molecule thereof, at least a hydrophilic group and the above-mentioned specific reactive group can be used without any particular limitation. Preferred embodiments thereof include polymers having a structure represented by the following general formula (1) or (2).

<<Specific Hydrophilic Polymer Represented by the General Formula (1)>>

The specific hydrophilic polymer represented by the general formula (1), which will be hereinafter referred to as the "specific hydrophilic polymer (1)" in some cases, is characterized by having a silane coupling group at its terminal.

GENERAL FORMULA (1)

General formula (1)

(iii)

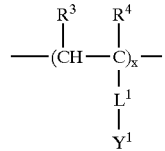
(i)

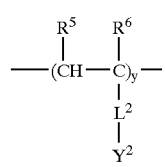
(ii)

The polymer compound represented by the general formula (1) has a silane coupling group represented by a structural unit (iii) at least one of both terminals of a polymer unit thereof represented by a structural unit (i) or (ii). The polymer compound may have a hydrogen atom or a functional group capable of initiating polymerization.

In the general formula (1), m is 0, 1 or 2, and $R^1$, $R^2$, $R^3$, $R^4$, $R^5$ and $R^6$ each independently represent a hydrogen atom or a hydrocarbon group having 8 or less carbon atoms. Examples of the hydrocarbon group include alkyl and aryl groups. Linear, branched or cyclic alkyl groups having 8 or less carbon atoms are preferred. Specific examples thereof include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl and cyclopentyl groups.

Preferably, $R^1$ to $R^6$ each independently represent a hydrogen atom, a methyl group, or an ethyl group from the standpoint of advantageous effect and easy availability.

These hydrocarbon groups may have a substituent.

When the alkyl group has a substituent, the substituted alkyl group has a structure in which the substituent and an alkylene group are bonded to each other. As the substituent, any monovalent non-metallic atomic group except hydrogen can be used. Preferred examples thereof include halogen atoms (—F, Br, —Cl, and —I); and the following groups or conjugated base groups: hydroxyl group, alkoxy group, aryloxy group, mercapto group, alkylthio group, arylthio group, alkyldithio group, aryldithio group, amino group, N-alkylamino group, N,N-diarylamino group, N-alkyl-N-arylamino group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, acylthio group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, N-aryl-N-aryloxycarbonylamino group, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo (—SO₃H) and conjugated base groups thereof (referred to as sulfonato) group, alkoxysulfonyl group, aryloxysulfonyl group, sulfinamoyl group, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, phosphono (—PO₃H₂) group and conjugated base groups thereof (referred to as phosphonato hereinafter) group, dialkylphosphono (—PO₃(alkyl)₂) group, diarylphosphono (—PO₃(aryl)₂) group, alkylarylphosphono (—PO₃(alkyl)(aryl)) group, monoalkylphosphono (—PO₃H(alkyl)) group and conjugated base groups thereof (referred to as alkylphosphonato group hereinafter), monoarylphosphono (—PO₃H(aryl)) group and conjugated base groups thereof (referred to as arylphosphonato group hereinafter), phosphonoxy (—OPO₃H₂) group and conjugated base groups thereof (referred to phosphonatoxy group hereinafter), dialkylphosphonoxy (—OPO₃(alkyl)₂) group, diarylphosphonoxy (—OPO₃(aryl)₂) group, alkylarylphosphonoxy (—OPO(alkyl)(aryl)) group, monoalkylphosphonoxy (—OPO₃H(alkyl)) group and conjugated base groups thereof (referred to as alkylphosphonatoxy group hereinafter), monoarylphosphonoxy (—OPO₃H(aryl)) group and conjugated base groups thereof (referred to as arylphosphonatoxy group hereinafter), morpholino group, cyano group, nitro group, aryl group, alkenyl group and alkynyl group.

Specific examples of the alkyl group in these substituent are the same alkyl groups as described above. Specific examples of the aryl group therein include phenyl group, biphenyl group, naphthyl group, 2-tolyl group, xylyl group, mesityl group, cumenyl group, chlorophenyl group, bromophenyl group, chloromethylphenyl group, hydroxyphenyl group, methoxyphenyl group, ethoxyphenyl group, phenoxypehnyl group, acetoxyphenyl group, benzoyloxyphenyl group, methylthiophenyl group, phenylthiophenyl group, methylaminophenyl group, dimethylaminophenyl group, acetylaminophenyl group, carboxyphenyl group, methoxycarbonylphenyl group, ethoxyphenylcarbonyl group, phenoxycarbonylphenyl group, N-phenylcarbamoylphenyl group, phenyl group, cyanophenyl group, sulfophenyl group, sulfonatophenyl group, phosphonophenyl group, and phosphonatophenyl group. Examples of the alkenyl group therein include vinyl group, 1-propenyl group, 1-butenyl group, cinnamyl, and 2-chloro-1-ethenyl groups. Examples of the alkynyl group therein include ethynyl group, 1-propynyl, 1-butynyl group, and trimethylsilylethynyl group. Examples of $G^1$ in the acyl group($G^1CO$—) therein include hydrogen and the same alkyl and aryl groups as described above.

Among these substituents, more preferred are halogen atoms (—F, Br, —Cl and —I), and alkoxy group, aryloxy group, alkylthio group, arylthio group, N-alkylamino group, N,N-dialkylamino group, acyloxy group, N-alkylcarbamoyloxy group, N-arylcarbamoyloxy group, acylamino group, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N-alkyl-N-arylcarbamoyl group, sulfo group, sulfonato group, sulfamoyl group, N-alkylsulfamoyl group, N,N-dialkylsulfamoyl group, N-arylsulfamoyl group, N-alkyl-N-arylsulfamoyl group, phosphono group, phosphonato group, dialkylphosphono group, diarylphosphono group, monoalkylphosphono group, alkylphosphonato group, monoarylphosphono group, arylphosphonato group, phosphonoxy group, phosphonatoxy group, aryl group, and alkenyl group.

The alkylene group in the substituted alkyl group may be a bivalent organic residue obtained by removing any hydrogen atom on the alkyl group from the above-mentioned alkyl group having 1 to 20 carbon atoms. Preferred examples thereof include linear alkylene groups having 1 to 12 carbon atoms, branched alkylene groups having 3 to 12 carbon atoms, and cyclic alkylene groups having 5 to 10 carbon atoms. Preferred and specific examples of the substituted alkyl group obtained by combining the substituent with the alkylene group include chloromethyl group, bromomethyl group, 2-chloroethyl group, trifluoromethyl group, methoxymethyl group, methoxyethoxyethyl group, allyloxymethyl group, phenoxymethyl group, methylthiomethyl group, tolylthiomethyl group, ethylaminoethyl group, diethylaminopropyl group, morpholinopropyl group, acetyloxymethyl group, benzoyloxymethyl group, N-cyclohexylcarbamoyloxyethyl group, N-phenylcarbamoyloxyethyl group, acetylaminoethyl group, N-methylbenzoylaminopropyl group, 2-oxyethyl group, 2-oxypropyl group, carboxypropyl group, methoxycarbonylethyl group, allyloxycarbonylbutyl group, chlorophenoxycarbonylmethyl group, carbamoylmethyl group, N-methylcarbamoylethyl group, N,N-dipropylcarbamoylmethyl group, N-(methoxyphenyl)carbamoylethyl group, N-methyl-N-(sulfophenyl)carbamoylmethyl group, sulfobutyl group, sulfonatobutyl group, sulfamoylbutyl group, N-ethylsulfamoylmethyl group, N,N-dipropylsulfamoylpropyl group, N-tolylsulfamoylpropyl group, N-methyl-N-(phosphonophenyl)sulfamoyloctyl group, phosphonobutyl group, phosphonatohexyl group, diethylphosphonobutyl group, diphenylphosphonopropyl group, methylphosphonobutyl group, methylphosphonatobutyl group, tolylphosphonohexyl group, tolylphosphonatohexyl group, phosphonoxypropyl group, phosphonatoxybutyl group, benzyl group, phenethyl group, α-methylbenzyl group, 1-methyl-1-phenylethyl group, p-methylbenzyl group, cynnamyl group, allyl group, 1-propenylmethyl group, 2-butenyl group, 2-methylallyl group, 2-methylpropenylmethyl group, 2-propynyl group, 2-butynyl group, and 3-butynyl group.

$L^1$ and $L^2$ each represent a single bond and an organic linkage group. The organic linkage group is a polyvalent linkage group composed of non-metallic atoms, and is specifically composed of 1 to 60 carbon atoms, 0 to 10 nitrogen atoms, 0 to 50 oxygen atoms, and 1 to 100 hydrogen atoms, and 0 to 20 sulfur atoms. More specific examples of the linkage group include groups composed of any one of the following structural units or composed of any combination of these units.

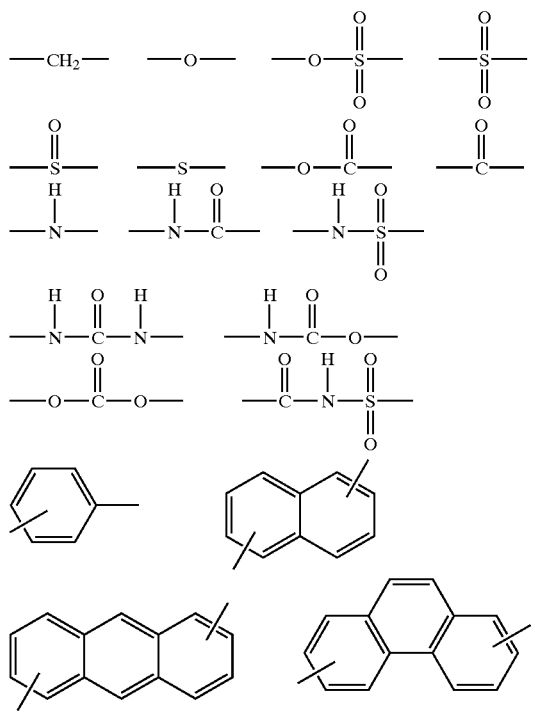

$L^3$ represents a single bond, or an organic linkage group, which is a polyvalent linkage group composed of non-metallic atoms. Specific examples thereof are the same as described as examples of the $L^1$ and $L^2$. A particularly preferred structure is —$(CH_2)_n$—S— wherein n is an integer of 1 to 8.

$Y^1$ and $Y^2$ each represent —$NHCOR^7$, —$N(R^7)(R^8)$, —$COR^7$, —OH, —$CO_2M$ or —$SO_3M$ wherein $R^7$ and $R^8$ each independently represent a linear, branched or cyclic alkyl group having 1 to 8 carbon atoms. In —$N(R^7)(R^8)$, $R^7$ and $R^8$ may be bonded to each other to form a ring. The formed ring may be a hetero ring, which contains a hetero atom such as an oxygen atom, a sulfur atom or a nitrogen atom. $R^7$ and $R^8$ may have a substituent. Examples of the substituent which can be introduced into $R^7$ or $R^8$ are the same substituents as described as examples of the substituent which can be introduced into $R^1$ to $R^6$ when they are alkyl groups.

Preferred and specific examples of $R^7$ and $R^8$ include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl, and cyclopentyl groups.

M represents a hydrogen atom; an alkali metal such as lithium, sodium or potassium; an alkali earth metal such as calcium, or barium; or an onium such as ammonium, iodonium or sulfonium.

Preferred and specific examples of $Y^1$ and $Y^2$ include —$NHCOCH_3$, —$NH_2$, —COOH, —$SO_3$—$NMe_4^+$ and morpholino groups.

The symbols x and y represent values satisfying the equation of x+y=100. The ratio of x to y (i.e., x:y) is from 100:0 to 1:99, and is preferably from 100:0 to 5:95.

The molecular weight of the specific hydrophilic polymer (1) is preferably from 1,000 to 100,000, more preferably from 1,000 to 50,000, and most preferably from 1,000 to 30,000.

Specific examples (1-1) to (1-23) of the specific hydrophilic polymer (1) which can be preferably used in the invention are listed below. In the invention, however, the specific hydrophilic polymer (1) is not limited to these examples.

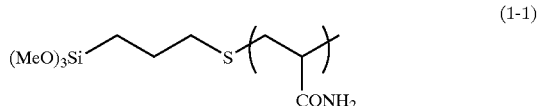

(1-1)

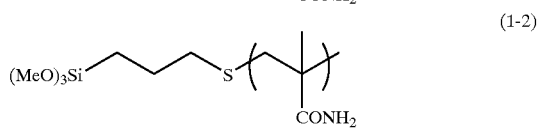

(1-2)

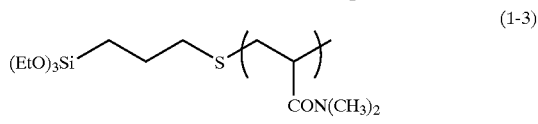

(1-3)

(1-4)

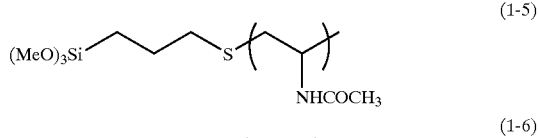

(1-5)

(1-6)

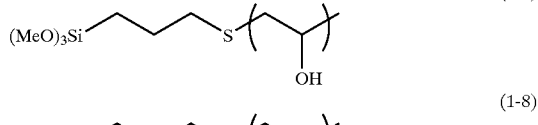

(1-7)

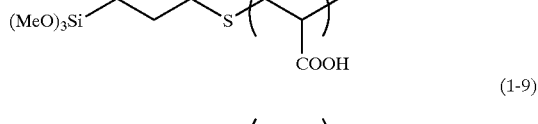

(1-8)

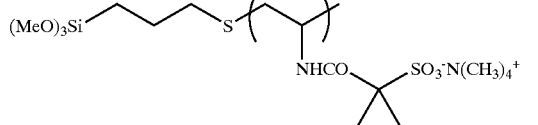

(1-9)

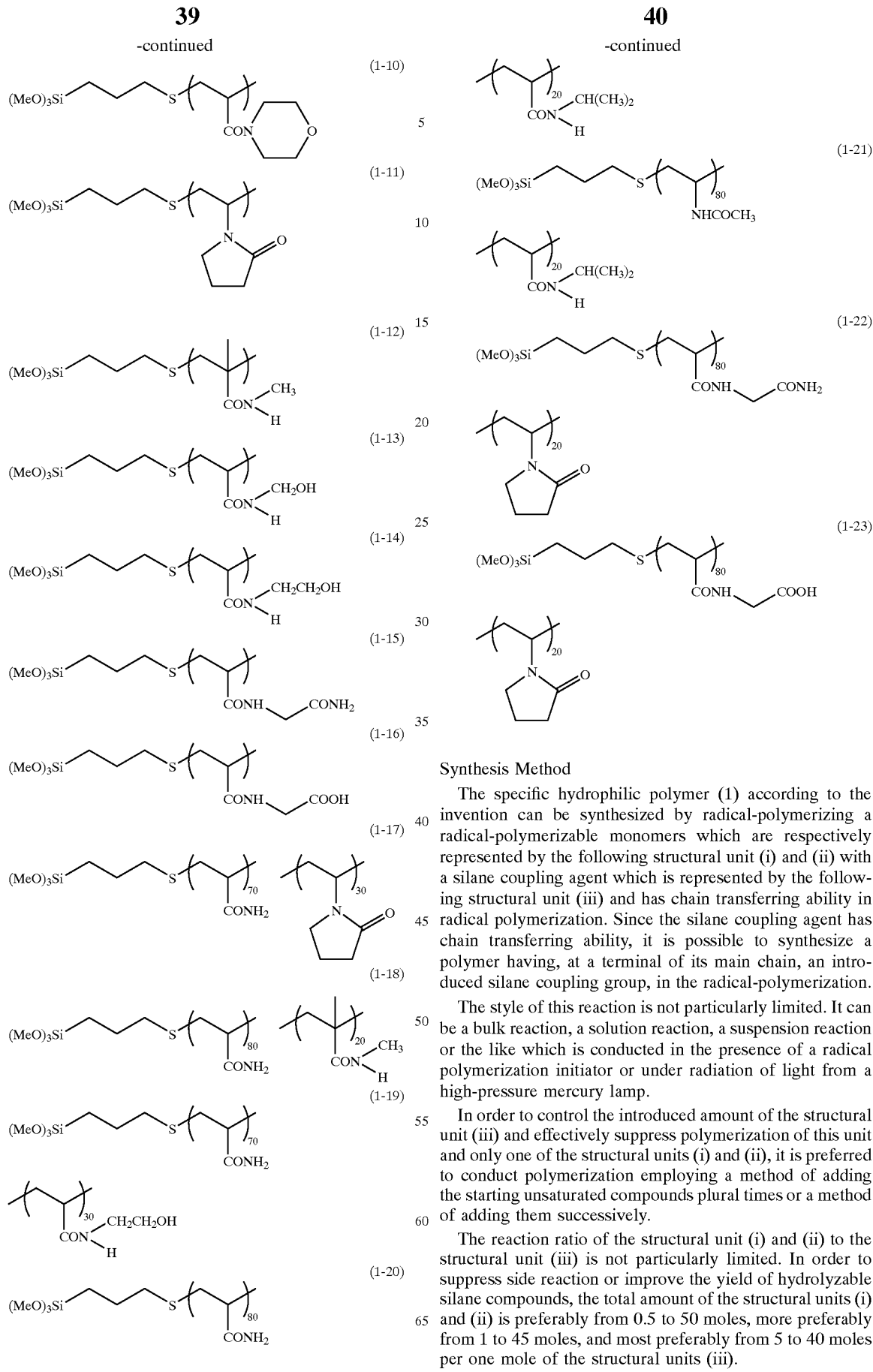

Synthesis Method

The specific hydrophilic polymer (1) according to the invention can be synthesized by radical-polymerizing a radical-polymerizable monomers which are respectively represented by the following structural unit (i) and (ii) with a silane coupling agent which is represented by the following structural unit (iii) and has chain transferring ability in radical polymerization. Since the silane coupling agent has chain transferring ability, it is possible to synthesize a polymer having, at a terminal of its main chain, an introduced silane coupling group, in the radical-polymerization.

The style of this reaction is not particularly limited. It can be a bulk reaction, a solution reaction, a suspension reaction or the like which is conducted in the presence of a radical polymerization initiator or under radiation of light from a high-pressure mercury lamp.

In order to control the introduced amount of the structural unit (iii) and effectively suppress polymerization of this unit and only one of the structural units (i) and (ii), it is preferred to conduct polymerization employing a method of adding the starting unsaturated compounds plural times or a method of adding them successively.

The reaction ratio of the structural unit (i) and (ii) to the structural unit (iii) is not particularly limited. In order to suppress side reaction or improve the yield of hydrolyzable silane compounds, the total amount of the structural units (i) and (ii) is preferably from 0.5 to 50 moles, more preferably from 1 to 45 moles, and most preferably from 5 to 40 moles per one mole of the structural units (iii).

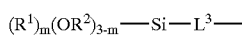 (iii)

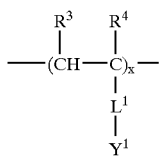 (i)

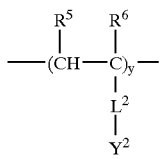 (ii)

In the structural units (i), (ii) and (iii), $R^1$ to $R^6$, $L^1$ to $L^3$, $Y^1$, $Y^2$ and m have respectively the same meanings as those in the general formula (1). These compounds are commercially available and also can easily be synthesized.

The radical polymerization method that is employed for synthesizing the specific hydrophilic polymer (1) may be any known radical polymerization method. Specifically, general radical polymerization methods are described in, for example, "Shin Koubunshi Jikkenngaku 3 Koubunshino Gouseito Hannou 1" (New Polymer Experiment 3, Synthesis and reaction 1 of Polymer, edited by the Society of Polymer Science, Japan and published by Kyoritsu Shuppan Co.), "Shin Jikkenn Kagaku Kouza 19, Koubunshi Kagaku (I)" (New Experimental Chemistry Lecture 19, Polymer Chemistry (I), edited by the Society of Chemistry in Japan and published by Maruzen Co., Ltd.) and "Bussitsu Kougaku Kouza, Koubushi Gousei Kagaku" (Material Engineering Lecture, Polymer Synthesis Chemistry, published by Tokyo Denki University Press). Methods described in these documents can be employed.

The specific hydrophilic polymer (1) may include another monomer as a copolymer component, which will be described below. Examples of the monomers that can be used include acrylic acid esters, methacrylic acid esters, acrylamides, methacrylamides, vinyl esters, styrenes, acrylic acid, methacrylic acid, acrylonitrile, maleic anhydride, maleic imide and other known monomers. By using such a monomer for copolymerization, it is possible to improve various physical properties such as film-formability, film strength, hydrophilicity, hydrophobicity, solubility, reactivity and stability.

Specific examples of the acrylic acid esters include methyl acrylate, ethyl acrylate, n- or i-propyl acrylate, n-, i-, sec- or t-butyl acrylate, amyl acrylate, 2-ethylhexyl acrylate, dodecyl acrylate, chloroethyl acrylate, 2-hydroxyethyl acrylate, 2-hydroxypropyl acrylate, 2-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)ethyl acrylate.

Specific examples of the methacrylic acid esters include methyl methacrylate, ethyl methacrylate, n- or i-propyl methacrylate, n-, i-, sec- or t-butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 2-hydroxypentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyloxy)ethyl methacrylate.

Specific examples of the acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-(sulfamoylphenyl)acrylamide, N-(phenylsulfonyl)acryalmide, N-(tolylsulfonyl)acrylamide, N,N-dimethylacrylamide, N-methyl-N-phenylacrylamide, and N-hydroxyethyl-N-methylacrylamide.

Specific examples of the methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxyphenyl)methacrylamide, N-(sulfamoylphenyl)methacrylamide, N-(phenylsulfonyl)methacryalmide, N-(tolylsulfonyl)methacrylamide, N,N-dimethylmethacrylamide, N-methyl-N-phenylmethacrylamide, and N-hydroxyethyl-N-methylmethacrylamide.

Specific examples of the vinyl esters include vinyl acetate, vinyl butyrate, and vinyl benzoate.

Specific examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlororstyrene, bromostyrene, iodostyrene, fluorostyrene, and carboxystyrene.

The proportion of the amount of the other monomer or monomers, which is used for the synthesis of the copolymer is required to be a proportion sufficient for improving the various physical properties. However, if the proportion is too large, the resultant copolymer has an insufficient function as a support for a planographic printing plate. Accordingly, the total proportion of the other monomer or monomers in the specific hydrophilic polymer (1) is preferably 80% by mass or less, more preferably 50% by mass or less.

<<Specific Hydrophilic Polymer Represented by the General Formula (2)>>

The specific hydrophilic polymer represented by the general formula (2), which will be hereinafter referred to as the "specific hydrophilic polymer (2)" in some cases, is characterized by having a silane coupling group on its side chain.

General formula (2)

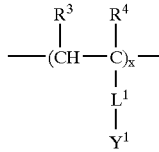

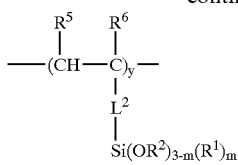

In the general formula (2), m, $R^1$ to $R^6$, $L^1$, $L^2$ and $Y^1$ have respectively the same meanings as those in the general formula (1).

The symbols x and y represent values satisfying the equation of x+y=100. The ratio of x to y (i.e., x:y) is from 99:1 to 50:50, preferably from 99:1 to 60:40, and more preferably form 98:2 to 70:30.

The molecular weight of the specific hydrophilic polymer (2) is preferably from 1,000 to 100,000, more preferably from 1,000 to 50,000, and most preferably from 1,000 to 30,000.

Specific examples (2-1) to (2-7) of the specific hydrophilic polymer (2) which can be preferably used in the invention are listed below. In the invention, however, the specific hydrophilic polymer (1) is not limited to these examples.

(2-1)

 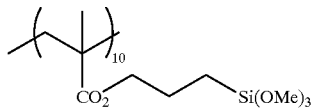

(2-2)

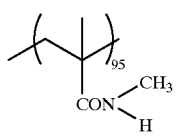 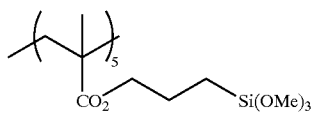

(2-3)

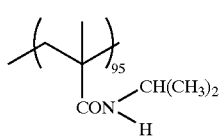 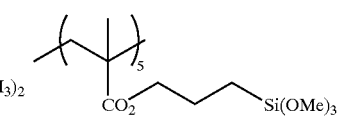

(2-4)

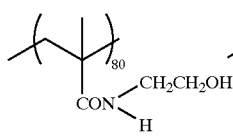 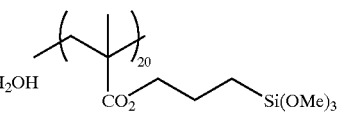

(2-5)

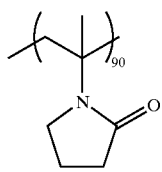 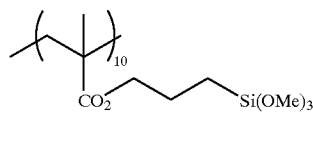

(2-6)

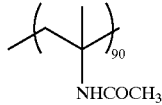 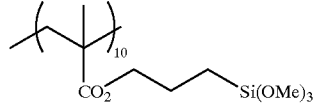

(2-7)

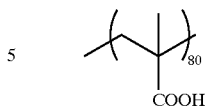 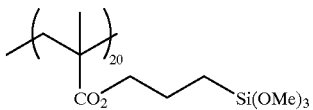

Synthesis Method

The radical polymerization method for synthesizing the specific hydrophilic polymer (2) may be any known radical polymerization method. Specifically, general radical polymerization is described in, for example, "Shin Koubunshi Jikkenngaku 3, Koubunshino Gouseito Kagaku" (New Polymer Experiment 3, Synthesis and reaction 1 of Polymer, edited by the Society of Polymer Science, Japan and published by Kyoritsu Shuppan Co.), "Shin Jikken Kagaku Kouza 19, Koubunshi Kagaku (I)" (New Experimental Chemistry Lecture 19, Polymer Chemistry (I), edited by the Society of Chemistry in Japan and published by Maruzen Co., Ltd.) and "Bussitsu Kagaku Kouza, Koubunshi Gousei Kagaku" (Material Engineering Lecture, Polymer Synthesis Chemistry, published by Tokyo Denki University press). Methods described in these documents can be used.

The specific hydrophilic polymer (2) may be a copolymer comprising another monomer as a copolymer component. Examples of the monomer to be used are the same as described in the case of the specific hydrophilic polymer (1).

<<Crosslinking Component Represented by the General Formula (3)>>

The hydrophilic surface in the invention may be a surface having a crosslinked structure (sol-gel crosslinked structure) formed by bonding the crosslinking groups in the specific hydrophilic polymer chemically and directly to $—Al^{3+}$ or a functional group such as a —OH group on the base material surface, or formed by preparing a hydrophilic coating-solution which contains the specific hydrophilic polymer, applying the coating-solution to the base material surface, drying the applied solution, and thus hydrolyzing and polycondensing the crosslinking group.

In order to form the sol-gel crosslinked structure, it is preferred to mix the specific hydrophilic polymer with a crosslinking component represented by the following general formula (3), apply the mixture onto the base material surface and then dry the mixture. The crosslinking component represented by the following general formula (3) is a compound which has a polymerizable functional group in the structure thereof, acts as a crosslinking agent, and is polycondensed with the specific hydrophilic polymer to form a strong coating having a crosslinked General formula (3)

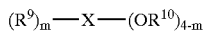

$(R^9)_m—X—(OR^{10})_{4-m}$ structure.

In the general formula (3), $R^9$ represents a hydrogen atom, or an alkyl or aryl group, $R^{10}$ represents an alkyl or aryl group, X represents Si, Al, Ti or Zr, and m represents an integer of 0 to 2.

In the case that $R^9$ or $R^{10}$ represents an alkyl group, the number of carbon atoms therein is preferably from 1 to 4. The alkyl or aryl group may have a substituent, and examples of the substituent which can be introduced include a halogen atom, an amino group, and a mercapto group.

This compound is preferably a low molecular weight compound, which has a molecular weight of 1000 or less.

Specific examples of the crosslinking component represented by the general formula (3) are listed up below. In the invention, however, the crosslinking component is not limited to these examples.

When X is Si, that is, when silicon is contained in the hydrolyzable compound, specific examples of the crosslinking component include trimethoxysilane, triethoxysilane, tripropoxysilane, tetramethoxysilane, tetraethoxysilane, tetrapropoxysilane, methyltrimethoxysilane, ethyltriethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane and diphenylethoxysilane.

Among these examples, particularly preferred examples are tetramethoxysilane, tetraethoxysilane, methyltrimethoxysilane, ethyltrimethoxysilane, methyltriethoxysilane, ethyltriethoxysilane, dimethyldiethoxysilane, phenyltrimethoxysilane, phenyltriethoxysilane, diphenyldimethoxysilane, diphenyldiethoxysilane, and the like.

When X is Al, that is, when aluminum is contained in the hydrolyzable compound, specific examples of the crosslinking component include trimethoxyaluminate, triethoxyaluminate, tripropoxyaluminate, and tetraethoxyaluminate.

When X is Ti, that is, when titanium is contained in the hydrolyzable compound, specific examples of the crosslinking component include trimethoxytitanate, tetramethoxytitanate, triethoxytitanate, tetraethoxytitanate, tetrapropoxytitanate, chlorotrimethoxytitanate, chlorortriethoxytitanate, ethyltrimethoxytitanate, methyltriethoxytitanate, ethyltriethoxytitanate, diethyldiethoxytitanate, phenyltrimethoxytitanate, and phenyltriethoxytitanate, When X is Zr, that is, when zirconium is contained in the hydrolyzable compound, specific examples of the crosslinking component include zirconates corresponding to the above-mentioned compounds exemplified as the titanium-containing components.

<Formation of the Hydrophilic Surface>

Preparation of a Hydrophilic Coating-solution

In order to prepare a hydrophilic coating-solution composition which contains the specific hydrophilic polymer, it is preferred that the content of the specific hydrophilic polymer is at least 10% and less than 50% by mass in terms of solid content thereof. If the content is 50% by mass or more, the film strength tends to lower. If the content is less than 10% by mass, the coating properties lower so that a possibility of cracking in the film becomes high. Thus, both of the cases are not preferred.

In a preferred embodiment in which the crosslinking component is added to the hydrophilic coating-solution composition, the amount of the crosslinking component to be added is preferably at least 5% by mol, more preferably at least 10% by mol of the silane coupling groups in the specific hydrophilic polymer. The upper limit of the amount of the added crosslinking component is not particularly limited if the component can be sufficiently crosslinked with the hydrophilic polymer. However, when the crosslinking component is excessively added, a problem may arise that the formed hydrophilic surface is made sticky by the crosslinking component which has not been concerned with crosslinking.

The hydrophilic polymer having, at its terminal, a silane coupling group, preferably together with the crosslinking component, is dissolved in a solvent, and then the solution is sufficiently stirred, whereby the used component(s) is/are hydrolyzed and polycondensed. The resultant organic/inorganic composite sol solution is a hydrophilic coating-solution used in the invention. By using this hydrophilic coating-solution, it becomes possible to provide a surface hydrophilic layer having a high hydrophilicity and film strength. In order to promote the hydrolysis and polycondensation at the time of preparing the organic/inorganic composite sol solution, it is preferred to use an acidic catalyst or a basic catalyst together. In order to obtain practically preferable reaction efficiency, it is essential to use the catalyst.

As the catalyst, an acid or a basic compound is used as it is or in a form in which it is dissolved in a solvent such as water or alcohol (hereinafter referred to as an acidic catalyst or a basic catalyst, respectively). The concentration of the acid or the basic compound in the solvent is not particularly limited, and may be appropriately selected depending on properties of the acid or basic compound to be used, a desired content of the catalyst, and the like. When the concentration is high, the rate of the hydrolysis or the polycondensation tends to increase. However, when the base catalyst having a high concentration is used, precipitation may be generated in the sol solution. Therefore, when the base catalyst is used, the concentration thereof is desirably 1 N or less as the converted concentration thereof in water.

The kind of the acidic catalyst or the basic catalyst is not particularly limited. When it is necessary to use a high-concentration catalyst, it is preferable to use a catalyst composed of elements which hardly remain in the coating after drying.

Specific examples of the acid catalyst include halogenated hydrogen such as hydrochloric acid, nitric acid, sulfuric acid, sulfurous acid, hydrogen sulfide, perchloric acid, hydrogen peroxide, carbonic acid, carboxylic acids such as formic acid and acetic acid, substituted carboxylic acids in which R in carboxylic acid structural formula RCOOH is substituted with a different element or a substituent, and sulfonic acids such as benzenesulfonic acid. Examples of the base catalyst include ammonic bases such as ammonia water, and amines such as ethylamine and aniline.

The hydrophilic coating-solution can be prepared by dissolving a hydrophilic polymer having, at its terminal, a silane coupling group (preferably together with a crosslinking component) in a solvent such as ethanol, adding the above-mentioned catalyst to the solution if desired, and stirring the solution. The reaction temperature is preferably from room temperature to 80° C. The reaction time (that is, the time when the stirring is continued) is preferably from 1 to 72 hours. This stirring helps proceeding of hydrolysis and polycondensation of respective components to yield an organic/inorganic composite gel solution.

As the solvent used in the preparation of the hydrophilic coating-solution composition which comprises the hydrophilic polymer and preferably comprises the crosslinking component, any solvent in which these components can be dissolved or dispersed can be used without particular limitation. Preferred examples thereof include aqueous solvents such as methanol, ethanol and water.

As described above, a sol-gel method is used in the preparation of the organic/inorganic composite sol solution (hydrophilic coating-solution composition) for forming the hydrophilic surface according to the invention. The sol-gel method is described in detail in published documents, such as Sumio Sakka "Zoru-Geruhouno Kagaku" (Science of Sol-Gel Method, published by Agne Shofu Co., Ltd. in 1988), and Ken Hirashima "Saishin Zoru-Geruhouniyoru Kinouseihakumaku Sakuseigijutu" (Technique for Forming a Functional Thin Film by Newest Sol-Gel Method, published by Synthetic Technique Center in 1992). The methods described in these documents can be employed in the preparation of the hydrophilic coating-solution composition according to the invention.

In the hydrophilic coating-solution composition in the invention, various additives can be used in accordance with their purposes as far as the advantageous effects of the invention are not damaged. For example, a surfactant can be added thereto in order to improve the homogeneity of the coating-solution.

The hydrophilic coating-solution prepared as described above is applied onto the support base material and then dried, whereby the hydrophilic surface can be provided. The film thickness of the hydrophilic surface can be appropriately selected. The amount of the applied film after drying is generally from 0.5 to 5.0 g/m$^2$, preferably from 1.0 to 3.0 g/m$^2$. If this amount is less than 0.5 g/m$^2$, the hydrophilic effect is not easily exhibited. If the amount is more than 5.0 g/m$^2$, the sensitivity and the film strength tend to lower. Thus, both cases are not preferable.

The planographic printing plate precursor of the invention can be prepared as described above.

[Exposure and Development]

The planographic printing plate precursors of the invention are imagewise exposed to light in accordance with properties of respective recording layers thereof. Specific examples of the method of the exposure include light irradiation, such as irradiation of an infrared ray with an infrared ray laser, irradiation of ultraviolet ray with an ultraviolet lamp, and irradiation of a visible ray; electron beam irradiation such as γ-ray radiation; and thermal energy application with a thermal head, a heat roll, a heating zone using a non-contact type heater or hot wind, or the like. Examples of a light source for these methods include a mercury lamp, a metal halide lamp, a xenon lamp, a chemical lamp, and a carbon arc lamp. Examples of a radioactive ray used for these methods include an electron ray, an X-ray, an ion beam, a far infrared ray, a g ray, an i ray, deep UV light, and a high-density energy beam (laser beam).

Examples of a laser used in laser exposure include gas lasers such as a carbon dioxide laser, a nitrogen laser, an Ar laser, a He/Ne laser, a He/Cd laser and a Kr laser; liquid (dye) lasers; solid lasers such as a ruby laser and a Nd/YAG laser; semiconductor lasers such as a GaAs/GaAlAs laser and an InGaAs laser; and excimer lasers such as a KrF laser, a XeCl laser, a XeF laser and an Ar$_2$ laser. Particularly preferred is exposure with semiconductor lasers which can radiate infrared rays having a wavelength of 700 to 1200 nm, solid lasers such as a YAG laser, and a high-power infrared ray laser.

Specific and preferred examples of generally-used embodiments include direct or indirect whole-surface heating by means of a heating device or the like; scanning exposure by an infrared ray, high-illuminance flash exposure with a xenon discharge lamp or the like, and whole-surface exposure with an infrared ray lamp.

When exposure with an active light ray is performed, it is preferred to use ultraviolet rays or visible rays. Ultraviolet ray exposure is particularly preferred since it gives an excellent polymerization rate. The main wavelength of the active light ray is preferably 250 nm or more and 800 nm or less.

Examples of a light source used in ultraviolet ray exposure include a low-pressure mercury lamp, a high-pressure mercury lamp, a fluorescent lamp, a xenon lamp, a carbon arc lamp, a tungsten incandescent lamp, and sunlight.

In the invention, development may be conducted immediately after laser radiation. However, it is preferred to conduct heating treatment between laser irradiation and development. Regarding conditions of the heating treatment, it is preferred that heating temperature ranges from 80 to 150° C. and heating time is from 10 seconds to 5 minutes. By this heating treatment, laser energy necessary for recording can be reduced when a laser is irradiated.

After the optional heating treatment, the planographic printing plate precursor of the invention is developed with an aqueous alkali solution. The developer and replenisher which can be used in the planographic printing plate precursor of the invention may be an aqueous alkali agent solution which has been known hitherto. Examples of the alkali agent used in the developer and the replenisher include inorganic salts such as sodium silicate, potassium silicate, trisodium phosphate, tripotassium phosphate, triammonium phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarboante, sodium borate, potassium borate, ammonium borate, sodium hydroxide, ammonium hydroxide, potassium hydroxide, and lithium hydroxide; and organic alkali agents such as monomethylamine, dimethylamine, trimethylamide, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents may be used alone or in combination of two or more thereof. Among these alkali agents, particularly preferred are silicate solutions such as sodium silicate solution and potassium silicate solution. This is because the developing property can be adjusted by the ratio of silicon oxide SiO$_2$, which is a component of silicates, to an alkali metal oxide M$_2$O, and their concentrations. For example, it is effective to use alkali metal silicates as described in JP-A No. 54-62004 and JP-B No. 57-7427.

In the case that an automatic processor is used to perform development, aqueous solution (replenisher) having a higher alkali intensity than that of the developer can be replenished into the developer if desired. This makes it possible to increase the alkali concentration in the alkali developer; therefore, a great number of the planographic printing plate precursors can be treated without exchanging developer in the developing tank for a long time. Specifically, it is preferable to add the alkali agent to the alkali developer so that the alkali developer will have a strong alkalinity, and for example, the pH thereof may be from 12.5 to 13.5, preferably from 12.8 to 13.3.

If desired, a surfactant or an organic solvent can be incorporated into the alkali developer in the invention. The surfactants which can be added include anionic, cationic, nonionic and amphoteric surfactants. Nonionic surfactants are particularly preferred. If a nonionic surfactant is incorporated into the alkali developer, the resistance of image portions against dissolution in the alkali developer is maintained; therefore, even if the planographic printing plate precursor is developed with the developer to which an aqueous solution having a high alkali intensity, as described above, is replenished, the development can be kept stable. This appears to result from interaction between the alkali soluble polymer compound and the nonionic surfactant. This interaction works intensely when the nonionic surfactant contains an ethylene oxide chain or a propylene oxide chain. The interaction works particularly intensely when the nonionic surfactant contains an ethylene oxide chain. It is considered that this may be caused by a strong interaction between alkali soluble groups, in particular, a phenolic hydroxyl group and the ethylene oxide chain.

As the nonionic surfactant, any known nonionic surfactant can be used without particular limitation. Examples thereof include polyoxyethylene alkyl ethers, polyoxyethylene alkyl phenyl ethers, polyoxyethylene polystyrylphenyl ethers, polyoxyethylene polyoxypropylene alkyl ether, glycerin aliphatic acid partial esters, sorbitan aliphatic acid partial esters, pentaerythritol aliphatic acid partial esters, propylene glycol aliphatic acid monoesters, sucrose aliphatic acid partial esters, polyoxyethylene sorbitan aliphatic acid partial esters, polyoxyethylene sorbitol aliphatic acid partial esters, polyethylene glycol aliphatic acid esters, polyglycerin aliphatic acid partial esters, polyoxyethylene-modified castor oil, polyoxyethylene glycerin aliphatic acid partial esters, aliphatic diethanolamides, N,N-bis-2-hydroxyalkylamines, polyoxyethylene alkylamines, triethanolamine aliphatic acid esters, and trialkylamine esters.

The amount of the nonionic surfactant added to the alkali developer is preferably from 0.001 to 5% by mass, more preferably from 0.01 to 3% by mass, and most preferably from 0.1 to 3% by mass. If this amount is less than 0.001% by mass, the nonionic surfactant may not act effectively. If the amount is more than 5% by mass, the interaction may become too strong so that the planographic printing plate precursor may not be developed. The weight average molecular weight of the nonionic surfactant is preferably from 300 to 50,000, more preferably from 500 to 5,000. The nonionic surfactants may be used alone or in combination of two or more thereof.

In order to improve the developing property, the dispersion of development refuse, and ink-affinity of image portions of the photosensitive planographic printing plate precursor in the invention, it is possible to add, to the alkali developer, a reducing agent (such as hydroquinone, resorcin, a sodium or potassium salt of an inorganic acid such as sulfurous acid or hydrogen sulfite acid), a development stabilizer, an organic carboxylic acid, an antifoamer, a surfactant other than nonionic surfactants, a water softener, an organic solvent, a known antiseptic, a colorant, a thickener, an antifoamer or the like as an additional component if desired. The printing plate developed with the above-mentioned developer and replenisher is subjected to post-treatment with washing water, a rinse solution containing a surfactant or the like, and a desensitizing liquid containing a gum arabic and a starch derivative. In the post-treatment in the case of using the planographic printing plate precursor of the invention, various combinations of these treatments may be used.

In recent years, automatic processors for printing plates have widely been used in order to rationalize and standardize plate-making working in the plate-making and printing industries. The automatic processor is composed of a developing section and a post-treating section, and comprises a device for carrying printing plates, various treating solution tanks, and spray devices. This machine pumps up respective treating solutions and sprays them onto an exposed printing plate from spray nozzles while carrying the printing plate horizontally. Recently, there has also been known a method of immersing and carrying a plating plate in treating solution tanks filled with treating solutions by means of in-liquid guide rolls. Such an automatic processing can be performed while replenishing replenishers into the respective treating solutions in accordance with the number of plates which have been treated, working time, and other factors. Also there may be employed so-called disposable processing method in which the processing is executed with a practically unused processing solution.

The planographic printing plate obtained as described above is coated with a desensitizing gum if desired, and the plate is subjected to a printing step. In order to make the printing durability of the planographic printing plate higher, the plate is subjected to baking treatment. In the case that the planographic printing plate is subjected to baking treatment, the plate is treated with a surface conditioner as described in JP-B Nos. 61-2518 and 55-28062, and JP-A Nos. 62-31859 and 61-159655. The method for the treatment is, for example, a method of applying the surface conditioner to the planographic printing plate with a sponge or absorbent cotton infiltrated with this solution, a method of immersing the planographic printing plate in a vat filled with the surface conditioner, or a method of applying the surface conditioner to the planographic printing plate with an automatic coater. If the amount of the applied solution is made even with a squeegee or a squeezing roller after the application thereof, a better result is obtained.

In general, the amount of the applied surface conditioner is suitably from 0.03 to 0.8 $g/m^2$ (dry mass). The planographic printing plate onto which the surface conditioner is applied is dried if necessary, and then the plate is heated to high temperature by a baking processor (for example, a baking processor (BP-1300) available from Fuji Photo Film Co., Ltd.) or the like. The heating temperature and the heating time in this case, though depending on the kinds of the components which form the image, are preferably from 180 to 300° C. and from 1 to 20 minutes, respectively. If necessary, the planographic printing plate which has been subjected to the baking treatment can be subjected to conventional treatments, such as water-washing treatment and gum coating treatment. However, in the case of using the surface conditioner which contains a water soluble polymer compound or the like, the so-called desentisizing treatment (for example, the gum coating) is unnecessary. The planographic printing plate obtained by treatments as described above is set in an offset printing machine or some other printing machine, and is used for printing a great number of sheets.

EXAMPLES

Hereinafter, the present invention will be specifically described by the following examples. However, the invention is not limited to these examples.

Example 1 to 6

[Synthesis of a Specific Polymer (PE-1)]

To a 200-mL three-neck flask to which 14.5 g of MFG (1-methoxy-2-propanol) had been added, 36.5 g of a MFG solution containing 8 g (54.0 mmols) of p-vinyl benzoate (manufactured by Hokko Chemical Industry Co., Ltd.), 6.1 g (36.0 mmols) of α-methacryloyloxy-γ-butyrolactone (manufactured by Daicel Chemical Industries, Ltd.), and 0.414 g of V601 (dimethyl 2,2'-azobisisobutyrate) was added dropwise at 75° C. in the nitrogen atmosphere over 2 hours. Then, reaction was continued for 5 hours. The reaction solution was subjected to reprecipitation treatment with ethyl acetate, and the resultant precipitation was separated by filtration and dried to yield 12.55 g (acid value: 3.424 meq/g, Mw: $9.424 \times 10^4$) of a specific polymer (PE-1), according to the invention, having the following composition.

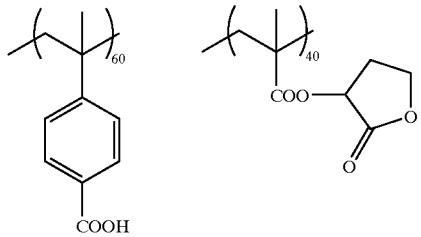

PE-1

[Synthesis of a Specific Polymer (PE-2)]

To a 200-mL three-neck flask to which 9.1 g of DMAc (N, N-dimethyl acetamide) had been added, a solution containing 11.9 g (70.0 mmol) of a-methacyloyloxy-γ-butyrolactone (manufactured by Daicel Chemical Industries, Ltd.), 7.61 g (30.0 mmol) of vinylbenzyltriethylammonium chloride, 1.15 g of V-601 (dimethyl 2,2'-azobisisolactate), and 36.4 g of DMAc was added dropwise at 75° C. in the nitrogen atmosphere over 2 hours. Then, the reaction was continued for 5 hours. The reaction solution was subjected to reprecipitation treatment with ethyl acetate, and the resultant precipitation was separated by filtration and dried to yield 15.6 g of a specific polymer (PE-2) according to the invention.

[Synthesis of a Specific Polymer (PE-3)]

To a 200-mL three-neck flask to which 16.7 g of DMAc (N, N-dimethyl acetamide) had been added, a solution containing 7.4 g (50.0 mmol) of p-vinylbenzoic acid (manufactured by Hokko Chemical Industry Co., Ltd.), 6.8 g (40.0 mmol) of α-methacyloyloxy-γ-butyrolactone (manufactured by Daicel Chemical Industries, Ltd.), 2.54 g (10.0 mmol) of vinylbenzyltriethylammonium chloride, 1.15 g of V-601 (dimethyl 2,2'-azobisisolactate), and 50.3 g of DMAc was added dropwise at 75° C. in the nitrogen atmosphere over 2 hours. Then, the reaction was continued for 5 hours. The reaction solution was subjected to reprecipitation treatment with ethyl acetate, and the resultant precipitation was separated by filtration and dried to yield 13.88 g of a specific polymer (PE-3) according to the invention.

To a 200-mL three-neck flask to which 16.0 g of DMAc (N, N-dimethyl acetamide) had been added, a solution containing 10.4 g (70.0 mmol) of p-vinylbenzoic acid (manufactured by Hokko Chemical Industry Co., Ltd.), 3.4 g (20.0 mmol) of α-methacyloyloxy-γ-butyrolactone (manufactured by Daicel Chemical Industries, Ltd.), 1.3 g (10.0 mmol) of 2-hydroxyethyl methacrylate, 1.15 g of V-601 (dimethyl 2,2'-azobisisolactate), and 48.3 g of DMAc was added dropwise at 75° C. in the nitrogen atmosphere over 2 hours. Then, the reaction was continued for 5 hours. The reaction solution was subjected to reprecipitation treatment with ethyl acetate, and the resultant precipitation was separated by filtration and dried to yield 14.1 g of a specific polymer (PE-4) according to the invention.

The structures of the specific polymers (PE-2) to (PE-4) are shown below.

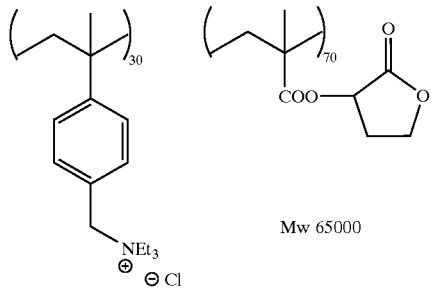

PE-2

Mw 65000

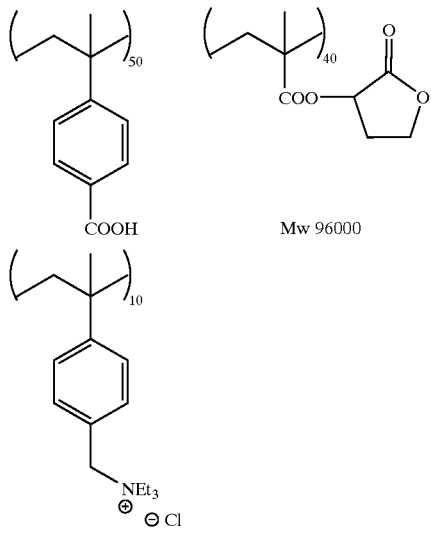

PE-3

Mw 96000

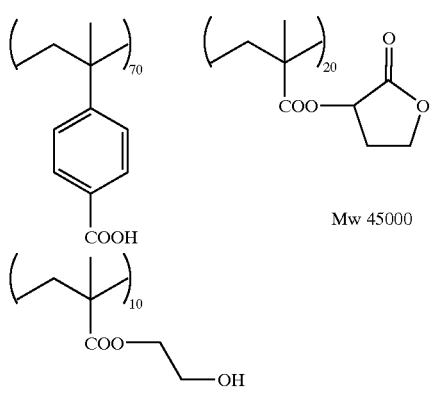

PE-4

Mw 45000

[Synthesis of an Alkali Soluble Polymer Compound 1]

Into a 500-mL three-neck flask provided with a stirrer, a cooling tube and a dropping funnel, 31.0 g (0.36 mol) of methacrylic acid, 39.1 g (0.36 mol) of ethyl chloroformate, and 200 mL of acetonitrile were added. The mixture was stirred while the flask was cooled in an ice water bath. To this mixture, 36.4 g (0.36 mol) of triethylamine was added dropwise through the dropping funnel over 1 hour. After the completion of the addition, the ice water bath was removed, and then the mixture was stirred at room temperature for 30 minutes.

To this mixture, 51.7 g (0.30 mol) of p-aminobenzenesulfonamide was added. The mixture was stirred for 1 hour while the flask was kept at 70° C. in an oil bath. After the completion of the reaction, this mixture was poured into 1 liter of water while the water was stirred. The resultant mixture was then stirred for 30 minutes. This mixture was filtered to separate a precipitation. Thereto, 500 mL of water was added to prepare a slurry. This slurry was filtrated, and the obtained solid was dried to yield a while solid of N-(p-aminosulfonylphenyl)methacrylamide (yield: 46.9 g).

Next, into a 100-mL three-neck flask provided with a stirrer, a cooling tube and a dropping funnel, 5.04 g (0.0210 mol) of N-(p-aminosulfonylphenyl)methacrylamide, 2.05 g (0.0180 mol) of ethyl methacrylate, 1.11 g (0.021 mol) of acetonitrile and 20 g of N,N-dimethylacetoamide were added. The mixture was stirred while the flask was kept at 65° C. in a hot water bath. To this mixture, 0.15 g of V-65 (available from Wako Pure Chemicals Industries) was added dropwise. The mixture was stirred under nitrogen gas flow for 2 hours while the temperature of the mixture was kept at 65° C. To this reaction mixture, a mixture of 5.04 g of N-(p-aminosulfonylphenyl)methacrylamide, 2.05 g of ethyl methacrylate, 1.11 g of acrylonitrile, 20 g of N,N-dimethylacetoamide and 0.15 g of V-65 were added dropsise over 2 hours through the dropping funnel. After the completion of the addition, the resultant mixture was stirred at 65° C. for 2 hours.

After the completion of the reaction, 40 g of methanol was added to the mixture and then the resultant mixture was cooled and poured into 2 liters of water while this water was stirred. The mixture was stirred for 30 minutes, and then the obtained precipitation was collected by filtration and dried to yield 15 g of a while solid. The weight average molecular weight (polystyrene standard) of this alkali soluble polymer compound 1 was measured by gel permeation chromatograph. As a result, the molecular weight was 53,000.

[Production of Support]

Support 1 through 3 were prepared by subjecting JIS A 1050 aluminum plates having a thickness of 0.3 mm to the following treatments.

(a) Mechanical Surface-Roughening

Mechanical surface-roughening was carried out by using a rotating nylon brush roller while a suspension consisting of an abrasive (quartz sand) having a specific gravity of 1.12 and water was supplied to the surface of the aluminum plate as an abrasive slurry solution. The average particle diameter of the abrasive was 8 $\mu$m and the maximum particle size of the abrasive was 50 $\mu$m. The material of the nylon brush was Nylon-6,10 having a hair length of 50 mm and a hair diameter of 0.3 mm. The nylon brush was produced by forming holes in a solid stainless cylinder having a diameter ($\Phi$) of 300 mm, and implanting hairs densely into the holes. Three rotating brushes were used. The distance between two support rollers ($\Phi$: 200 mm) disposed under the brushes was 300 mm. The brush roller was pressed against the aluminum plate to such a degree that the load of the driving motor for rotating the brushes became larger by 7 kW than the load before the nylon brush was pressed against the aluminum plate. The direction of rotation of the brush was the same as the direction of movement of the aluminum plate. The rotating rate of the brush was 200 rpm.

(b) Alkali-etching

An aqueous NaOH solution (having a NaOH concentration of 26% by mass and aluminum ion concentration of 6.5% by mass) at 70° C. was sprayed on the aluminum plate to carry out etching. As a result, the amount of the aluminum plate dissolved was 6 g/m². Thereafter, the aluminum plate was washed with well water by using a spray.

(c) Desmutting

A 1% by mass aqueous sulfuric acid solution (containing 0.5% by mass of aluminum ion) at 30° C. was sprayed on the aluminum plate to carry out desmutting. Thereafter, the aluminum plate was washed with water by using a spray. The aqueous sulfuric acid solution was a waste fluid of the electrochemical surface-roughening in a aqueous sulfuric acid solution with an alternating current.

(d) Electrochemical Surface-Roughening

A continuous electrochemical surface-roughening was carried out by using an alternating current of 60 Hz. The electrolysis solution used was an aqueous nitric acid solution (having a nitric acid concentration of 10.5 g/l and aluminum ion concentration of 5 g/l) at 50° C. The alternating current used was a rectangular alternating current having trapezoidal form, TP (the time between zero current to the peak current) of 0.8 mseq, and DUTY ratio of 1:1. A carbon electrode was used as the counter electrode. Ferrite was used as an auxiliary electrode. The electrolytic bath used was of radial-cell type.

The current density was 30 A/dm² at the peak, and the quantity of electricity was 220 C/dm² in terms of the sum of the electricity when the aluminum plate functioned as the anode. The auxiliary anode received 5% of the electric current from the power cell. Thereafter, the aluminum plate was washed with water by using a spray.

(e) Alkali-etching

An aqueous solution containing 26% by mass of NaOH and 6.5% by mass of aluminum ions was sprayed on the aluminum plate to carry out etching at 32° C. The amount of the aluminum plate dissolved was 0.20 g/m². Smut components mainly consisting of aluminum hydroxide generated at the electrochemical surface-roughening with the alternating current were removed, and edge portions of the generated pits were dissolved to smoothen the edge portions. Thereafter, the aluminum plate was washed with water by using a spray.

(f) Desmutting

An aqueous solution containing 15% by mass of nitric acid and 4.5% by mass of aluminum ion were sprayed onto the aluminum plate to carry out desmutting at 30° C. Thereafter, the aluminum plate was washed with well water by using a spray. The aqueous nitric acid solution was a waste fluid of the electrochemical surface-roughening in a aqueous nitric acid solution with an alternating current.

(g) Electrochemical Surface-roughening

A continuous electrochemical surface-roughening was carried out by using an alternating current of 60 Hz. The electrolysis solution used was an aqueous hydrochloric acid solution (having a hydrochloric acid concentration of 7.5 g/l and aluminum ion concentration of 5 g/l) at 35° C. The alternating current used was a rectangular alternating current having trapezoidal form. A carbon electrode was used as the counter electrode. Ferrite was used as an auxiliary electrode. The electrolytic bath used was of radial-cell type.

The current density was 25 A/dm² at the peak, and the quantity of electricity was 50 C/dm² in terms of the sum of the electricity when the aluminum plate functioned as the anode. Thereafter, the aluminum plate was washed with water by using a spray.

(h) Alkali-etching

An aqueous solution containing 26% by mass of NaOH and 6.5% by mass of aluminum ions was sprayed on the aluminum plate to carry out etching at 32° C. The amount of the aluminum plate dissolved was 0.10 g/m². Smut components mainly consisting of aluminum hydroxide generated at the electrochemical surface-roughening with the alternating current were removed, and edge portions of the generated pits were dissolved to smoothen the edge portions. Thereafter, the aluminum plate was washed with water by using a spray.

(i) Desmutting

An aqueous solution containing 25% by mass of sulfric acid and 0.5% by mass of aluminum ion were sprayed onto the aluminum plate to carry out desmutting at 60° C. Thereafter, the aluminum plate was washed with well water by using a spray.

(j) Anode-Oxidation 170 g/l sulfuric acid solutions containing 0.5% by mass of aluminum ion at 43° C. was used as electrolysis solutions to anode-oxidizing the aluminum plate. Thereafter, the aluminum plate was washed with well water. At the anode-oxidation, the current density was about 30 A/dm². The amount of the generated oxide film was 2.7 g/m².

(k) Treatment with Alkaline Metal Silicate

The aluminum plate after the anode-oxidation was treated with an alkaline metal silicate (silicate treatment) by being immersed in a 1% by mass aqueous solution of sodium silicate No. 3 at 30° C. for 10 seconds. Thereafter, the aluminum plate was washed with well water. The amount of the silicate held by the aluminum plate was 3.5 mg/dm².

<Support 1>

The above processes (a) through (k) were conducted sequentially to prepare Support 1, wherein the etching amount at the process (e) was 3.5 g/m².

<Support 2>

The above processes, except for the processes (g), (h), and (i), were conducted sequentially to prepare Support 2.

<Support 3>

The above processes, except for the processes (a), (g), (h), and (i), were conducted sequentially to prepare Support 3.

[Formation of Intermediate Layer]

The following coating solution for intermediate layer was coated on each of Support 1 through 3. Thereafter, the supports were dried at 80° C. for 15 seconds, thereby intermediate layers were provided on the supports. The amount of the coated film on each support after drying was 15 mg/m².

| <Coating solution for intermediate layer> | |
|---|---|
| The specific polymer described in Table 1 | 0.3 g |
| Methanol | 100 g |
| Water | 1 g |

[Formation of Photosensitive Layer]

The following photosensitive layer coating solution 3 was coated on the surfaces of the intermediate layers provided on the supports as described above so that the coated amounts became 0.85 g/m². Then the films were dried by PERFECT OVENPH200 (manufactured by ESPEC Corp.) at 110° C. for 50 seconds with Wind Control set at 7. Thereafter, photosensitive layer coating solution 4 was further coated in an amount of 0.30 g/m². The films were dried at 120° C. for 1 minute to prepare planographic printing plate precursors.

| <Photosensitive layer coating solution 3> | |
|---|---|
| Alkali-soluble polymer compound 1 | 2.133 g |
| Cyanine dye A (having the following structure) | 0.109 g |
| 4,4'-bishydroxyphenylsulfone | 0.126 g |
| Tetrahydrophthalic acid anhydride | 0.190 g |
| p-toluene sulfonic acid | 0.008 g |
| 3-methoxy-4-diazodiphenylamine hexafluorophosphate | 0.030 g |
| Ethylviolet whose counter ion was changed to 6-hydroxy-2-naphthalene sulfonic acid anion | 0.100 g |
| Megaface F-780 manufactured by Dainippon Ink & Chemicals, Inc. (Fluorine-type surfactant for improving coated sufaces) | 0.035 g |
| Methylethyl ketone | 25.38 g |

| <Photosensitive layer coating solution 3> | |
|---|---|
| 1-methoxy-2-propanol | 13.0 g |
| γ-butyrolactone | 13.2 g |

Cyanine dye A

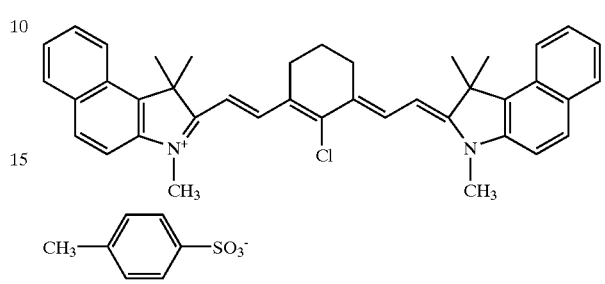

| [Photosensitive layer coating solution 4] | |
|---|---|
| m, p-cresol novolac (m/p = 6/4, weight-average molecular weight: 4,500, non-reacted cresol: 0.8% by mass) | 0.3478 g |
| Cyanine dye A (shown above) | 0.0192 g |
| Onium salt A (shown below) | 0.0115 g |
| Megaface F-780 (20%), manufactured by Dainippon Ink & Chemicals, Inc. (Fluorine-type surfactant for improving coated sufaces) | 0.022 g |
| Methylethyl ketone | 13.07 g |
| 1-methoxy-2-propanol | 6.79 g |

Onium Salt A

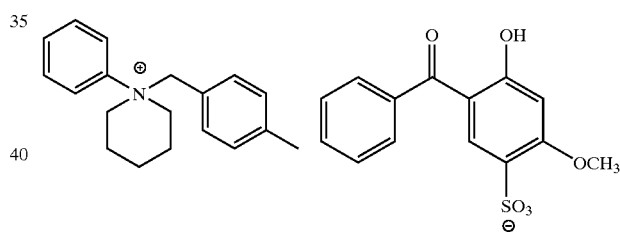

On the other hand, the following photosensitive coating solution 5 was coated on the intermediate layers provided on the supports as described above. The coated amounts after drying were 1.2 g/m². Thereby, planographic printing plate precursors of Examples 2, 4, and 7 were prepared.

| <Photosensitive layer coating solution 5> | |
|---|---|
| m, p-cresol novolac (m/p = 6/4, weight average molecular weight: 7,300, non-reacted cresol: 0.4% by mass) | 0.93 g |
| Vinyl polymer 2 (shown below) | 0.07 g |
| Infrared absorber 1 (Cyanine dye A shown above) | 0.017 g |
| Infrared absorber 2 (Cyanine dye B shown below) | 0.023 g |
| 2,4,6-tris(hexyloxy)benzenediazonium-2-hydroxy-4-methoxybenzophenone 5-sulfonate | 0.01 g |
| p-toluene sulfonic acid | 0.003 g |
| Cyclohexane 1,2-dicarbonic acid anhydride | 0.06 g |
| Victoria Pure Blue-BOH whose counter anion was changed to 1-naphthalene sulfonic acid anion | 0.015 g |
| Fluorine-type surfactant (Megaface F-176, manufactured by Dainippon Ink & Chemicals, Inc.) | 0.02 g |

-continued

<Photosensitive layer coating solution 5>

| | |
|---|---|
| Methylethyl ketone | 15 g |
| 1-methoxy-2-propanol | 7 g |

Cyanine Dye B

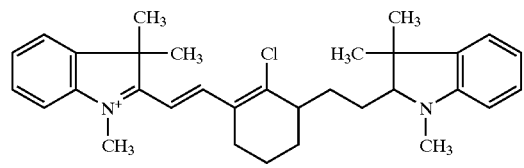

Vinyl polymer 2

Mw 48000
Acid value 2.23 meq/g

Planographic printing plate precusores of Comparative Examples 1 and 2 were prepared in the same manner as in the preparation of the planographic printing plate precursors of Examples 1 through 6, except that the intermediate polymers, the supports, the photosensitive coating solutions, and the developers used were changed to those shown in Table 1. The structure of the intermediate layer polymer, PA-0, are shown below.

PA-0

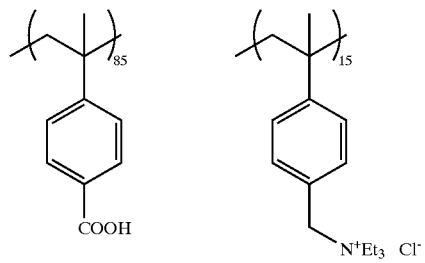

[Exposure and Development]

Each of the planographic printing plate precursors of Examples 1 to 6 and Comparative Examples 1 and 2 thus obtained was imagewise exposed by TrendSetter 3244F manufactured by Creo Co., with Setter exposure amount of 8.0 W at 150 rpm.

Then, Each of the planographic printing plate precursors of Examples 1 to 4 and Comparative Examples 1 and 2 was developed by automatic processor 900NP with DT1, a developer for PS plates containing substantially no alkaline metal silicates manufactured by Fuji Photo Film Co., Ltd., under standard condition. Each of the planographic printing plate precursors of Examples 5 and 6 were developed by automatic processor 900NP with DPE-4, a developer for PS plates containing alkaline metal silicates manufactured by Fuji Photo Film Co., Ltd., under standard condition.

[Evaluation]

Stain resistance in non-image portions and printing durability of each of the planographic printing plate precursors of Examples 1 to 6 and Comparative Examples 1 and 2 thus obtained, was evaluated as follows.

1. Stain Resistance in Non-image Portions

Each of the planographic printing plates obtained by the exposure and the development was used for printing by using Mitsubishi Daiya type F2 printer with DIC-GEOS(s) red ink. The stain on the blanket when 10,000 sheets were printed was evaluated with the naked eye.

With respect to the evaluation standard, a printing plate free of stain was evaluated as very good; a printing plate with hardly any stain was evaluated as good; and a printing plate with remarkable stain was evaluated as bad. The results are shown in Table 1.

2 Eualuation of Printing Durability

Each of the planographic printing plates obtained by the exposure and the development was used for printing by using printer Lithrone, manufactured by Komori Corporation with black ink DIC-GEOS (N), manufactured by Dainippon Ink and Chemicals Incorporated. The printing durability was evaluated by the number of sheets printed before decrease in the image density of the solid image began to be recognized with the naked eye. The results are shown in Table 1.

TABLE 1

| | Intermediate Layer Polymer | Support | Photosensitive Layer Coating Solution | Developer | Stain Resistance | Printing Durability (×10,000 sheets) |
|---|---|---|---|---|---|---|
| Example 1 | PE-1 | 1 | Coating Solution 3 and 4 | DT-1 | Very Good | 9.5 |
| Example 2 | PE-2 | 2 | Coating Solution 5 | DT-1 | Good | 10 |
| Example 3 | PE-3 | 1 | Coating Solution 3 and 4 | DT-1 | Very Good | 11 |
| Example 4 | PE-4 | 3 | Coating Solution 5 | DT-1 | Very Good | 9.5 |
| Example 5 | PE-1 | 1 | Coating Solution 3 and 4 | DT-4 | Very Good | 10 |

TABLE 1-continued

| | Intermediate Layer Polymer | Support | Photosensitive Layer Coating Solution | Developer | Stain Resistance | Printing Durability (×10,000 sheets) |
|---|---|---|---|---|---|---|
| Example 6 | PE-3 | 1 | Coating Solution 3 and 4 | DT-4 | Very Good | 11 |
| Comparative Example 1 | PA-0 | 1 | Coating Solution 3 and 4 | DT-1 | Good | 8.0 |
| Comparative Example 2 | PA-0 | 1 | Coating Solution 5 | DT-1 | Good | 7.5 |

As is obvious from Table 1, the printing plates of Examples each of which contained a polymer having a lactone group had stain resistance in non-image portions equal to or better than that of the printing plates of Comparative Examples each of which did not contain a polymer having a lactone group. Moreover, the printing plates of Examples had superior printing durability. Particularly, it is apparent that the printing plates of Examples 3 and 6 each of which contained a polymer having an acid group and an onium-structure-containing functional group in addition to a lactone group in the intermediate layer had improved stain resistance and printing durability.

Also, it was found that printing plates without practical problems were obtained in both of the cases where a developer practically not containing an alkaline metal silicate (non-silicate developer) was used in the development and where a developer containing an alkaline metal silicate (silicate developer) was used in the development.

Examples 7 to 10

[Formation of Negative-type Recording Layer]
[Preparation of Support]

Melted alloy of JIS A1050 containing 99.5% or more of Al, 0.30% of Fe, 0.10% of Si, 0.02% of Ti, and 0.013% of Cu was cleaned and used for casting. The cleaning treatment included degassing for excluding unnecessary gasses such as hydrogen from the melted alloy, and ceramic tube filter treatment. The casting method employed was the DC casting method. Solidified cast lump having a thickness of 500 mm was faced by 10 mm from the surface, then homogenized at 550° C. for 10 hours for preventing inter-metallic compound from growing large.

Thereafter, the alloy was hot-rolled at 400° C., process annealed at 500° C. for 60 seconds in continuous annealing furnace, then cold-rolled to prepare a rolled aluminum plate having a thickness of 0.30 mm. The center-line average roughness Ra of the plate after cold-rolling was controlled at 0.2 μm by controlling the roughness of the rolling roll. The plate was subjected to tension-leveler for improving the planarity of the plate.

The aluminum plate was then subjected to surface-treatments for preparing a support for planographic printing plate.

The aluminum plate was subjected to a degreasing treatment in 10% aqueous sodium aluminate solution at 50° C. for 30 seconds for removing rolling oil from the surfaces of the aluminum plate. Then, the aluminum plate was subjected to a desmutting treatment at 50° C. for 30 seconds in 30% sulfuric acid solution.

Next, the aluminum plate was subjected to a graining treatment, a treatment of roughening a surface of a support, for improving contact characteristics between the support and the recording layer and imparting water-holding capacity to non-image portions. An electrolytic graining was conducted by immersing the aluminum web in a solution containing 1% of nitric acid and 0.5% of aluminum nitrate kept at 45° C. and providing 240 C/dm$^2$ of anode quantity of electricity in alternating wave form having a current density of 20 A/dm$^2$ and a Duty-ratio of 1:1 supplied by indirect power cell. Thereafter, the aluminum plate was subjected to an etching treatment in 10% aqueous sodium aluminate solution at 50° C. for 30 seconds, subjected to neutralization treatment in 30% aqueous sulfuric acid solution at 50° C. for 30 seconds, then subjected to a desmutting treatment.

Oxide film was formed on the support by anode-oxidation, for improving wear resistance, chemical resistance, and water-holding capacity of the support. 2.5 g/m$^2$ of oxide film on anode was provided by transporting the aluminum web in an electrolyte (20% aqueous sulfuric acid solution) at 35° C. with 14 A/dm$^2$ of direct current supplied by an indirect power cell.

Intermediate layers were provided on the supports obtained as described above in the same manner as in the cases of Examples 1 through 6. Then, recording layer coating solution 6 having the following composition was coated on the supports so that the coated amount after drying became 1.7 g/m$^2$. Thereby, planographic printing plate precursors of Examples 7 through 10 were prepared. The planographic printing plate precursor of Comparative Example 3 was prepared in the same manner as that in the case of Examples 7 through 10, except that the polymer PA-0 was used in the intermediate layer.

| <Recording layer coating-solution 6> | |
|---|---|
| alkali soluble polymer (having the following composition) | 1.0 g |
| radical polymerizable compound "DPHA" (having the following composition) | 1.0 g |
| infrared ray absorbing agent "IR-1" (having the following composition) | 0.10 g |
| radical generator "S-1" (having the following composition) | 0.30 g |
| naphthalenesulfonic acid salt of Victoria Pure Blue | 0.04 g |
| fluorine-type surfactant (trade name: MEGAFACE F-176, manufactured by Dainippon Ink & Chemicals Inc.) | 0.01 g |
| methyl ethyl ketone | 9.0 g |

-continued

<Recording layer coating-solution 6>

| | |
|---|---|
| methanol | 10.0 g |
| 1-methoxy-2-propanol | 8.0 g |

Alkali-soluble polymer

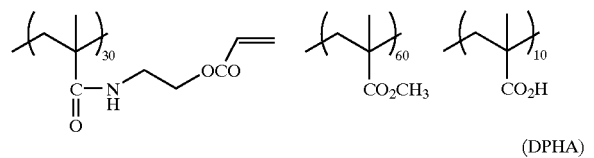

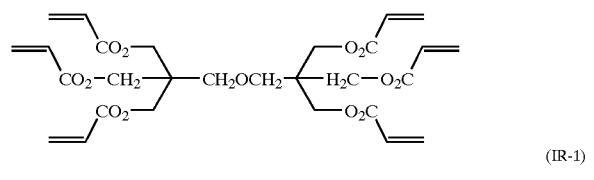

(DPHA)

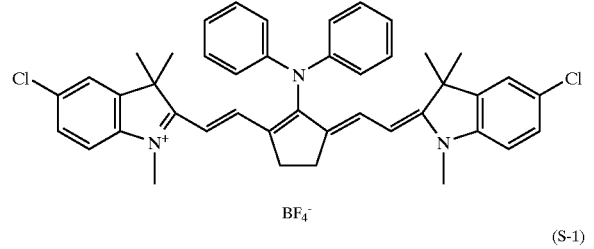

(IR-1)

(S-1)

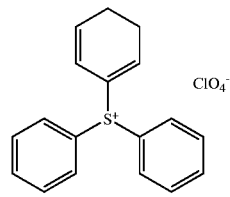

[Exposure]
The obtained negative-type planographic printing plate precursors were exposed by using a Trendsetter 3244 VFS, manufactured by Creo Co., on which a water-cooling type 40 W infrared ray semiconductor laser was mounted, with output of 9 W, an external face drum rotation rate of 210 rpm, a printing plate face energy of 100 mJ/cm², and a resolution of 2400 dpi.
[Development]
After the development, the printing plate precursors were developed by using automatic processor Stabron 900N. Both of the developers used as a charging solution and a replenisher was 1:4 (DV-2: water) diluted solution of DV-2 maunufactured by Fuji Photo Film Co., Ltd. The temperature of the developer was 30° C. Further, 1:1 (FN-6: water) diluted solution of FN-6, manufactured by Fuji Photo Film Co., Ltd. and having a pH of 10.8, was used as a finisher.
[Evaluation of Stain Resistance in Non-image Portions]
The stain resistance of each of the negative-type planographic printing plates was evaluated in the same manner as in Examples 1 through 6.
[Evaluation of Printing Durability]
The obtained planographic printing plates were used for printing by using R201 printer manufactured by RolandDG Corporation with GEOS-G(N) ink manufactured by Dainippon Ink and Chemicals Incorporated. Solid portions of the printed sheets were observed. The printing durability was evaluated by the number of sheets printed before decrease in the image density of the solid image began to be recognized with the naked eye. Larger number of sheets indicates better printing durability. The results are shown in Table 2.

TABLE 2

| | Intermediate Layer Polymer | Stain Resistance | Printing Durability (× 10,000 sheets) |
|---|---|---|---|
| Example 7 | PE-1 | Very Good | 8.5 |
| Example 8 | PE-2 | Good | 8 |
| Example 9 | PE-3 | Very Good | 9 |
| Example 10 | PE-4 | Very Good | 7 |
| Comparative Example 3 | PA-0 | Good | 5.5 |

As shown in Table 2, the negative-type printing plates of Examples, each of which contained a polymer having a lactone group in the intermediate layer showed stain resistance equal to or better than the negative-type printing plates of Comparative Example, each of which did not contain a polymer having a lactone group in the intermediate layer. Moreover, the negative-type printing plates of Examples showed superior printing durability.

According to the invention, it is possible to provide a planographic printing plate precursor which can be directly made a printing plate by scanning exposure based on digital signals, is superior in printing durability, and generates no stains in the non-image portions.

What is claimed is:
1. A planographic printing plate precursor, comprising an intermediate layer which includes a polymer having a lactone group, and a recording layer successively formed on a support.
2. A planographic printing plate precursor according to claim 1, wherein the polymer having a lactone group comprises a monomer having a lactone group which is represented by the following General formula (A) as a structure unit:

General formula (A)

wherein in General formula (A), R represents a hydrogen atom, an alkyl group, or a halogen atom; X represents a group represented by the following General formula (B) or (C); and Y represents a divalent connecting group:

General formula (B)

General formula (C)

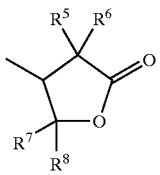

wherein in General formulae (B) and (C), $R^1$ through $R^8$ each independently represent a hydrogen atom or a hydrocarbon group having 1 to 30 carbon atoms which may be substituted.

3. A planographic printing plate precursor according to claim 1, wherein the lactone group in the polymer having a lactone group has a 5-membered ring lactone structure.

4. A planographic printing plate precursor according to claim 1, wherein a content of a monomer having a lactone group in the polymer having a lactone group is at least 1% by mol.

5. A planographic printing plate precursor according to claim 1, wherein a content of a monomer having a lactone group in the polymer having a lactone group is from 10 by mol to 95% by mol.

6. A planographic printing plate precursor according to claim 1, wherein a weight-averaged molecular weight of the polymer having a lactone group is from 500 to 1,000,000.

7. A planographic printing plate precursor according to claim 1, wherein a coated amount of the intermediate layer after drying is from 1 to 100 mg/m².

8. A planographic printing plate precursor according to claim 1, wherein the polymer having a lactone group further has an onium-structure-containing organic group.

9. A planographic printing plate precursor according to claim 1, wherein the polymer having a lactone group further has an acid group.

10. A planographic printing plate precursor according to claim 9, wherein the polymer having a lactone group further has an onium-structure-containing organic group.

11. A planographic printing plate precursor according to claim 1, wherein the intermediate layer comprising the polymer having a lactone group and a positive-type photosensitive layer have been successively formed on the support.

12. A planographic printing plate precursor according to claim 1, wherein the intermediate layer comprising the polymer having a lactone group and a negative-type photosensitive layer have been successively formed on the support.

13. A planographic printing plate precursor according to claim 1, wherein the intermediate layer comprising the polymer having a lactone group and a photosensitive layer comprising a compound which can form a hydrophobic portion by heating or irradiation of a radiation, have been successively formed on the support.

14. A planographic printing plate precursor according to claim 13, wherein the compound which can form a hydrophobic portion by heating or irradiation of a radiation is one of (a) a fine particle polymer having a heat-responsive functional group, or (b) a microcapsule encapsulating a compound having a heatresponsive functional group.

15. A planographic printing plate precursor according to claim 1, wherein the intermediate layer comprising the polymer having a lactone group and an infrared-laser sensitive positive-type photosensitive layer have been successively formed on the support.

* * * * *